United States Patent
Seo et al.

(10) Patent No.: US 12,133,402 B2
(45) Date of Patent: **\*Oct. 29, 2024**

(54) ORGANIC LIGHT-EMITTING DEVICE

(71) Applicant: SAMSUNG DISPLAY CO., LTD., Yongin-si (KR)

(72) Inventors: Dongkyu Seo, Yongin-si (KR); Dongchan Kim, Yongin-si (KR); Wonjong Kim, Yongin-si (KR); Eungdo Kim, Yongin-si (KR); Jihye Lee, Yongin-si (KR); Dahea Im, Yongin-si (KR); Sanghoon Yim, Yongin-si (KR); Yoonhyeung Cho, Yongin-si (KR); Wonsuk Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/340,664

(22) Filed: Jun. 23, 2023

(65) Prior Publication Data

US 2023/0345754 A1    Oct. 26, 2023

Related U.S. Application Data

(60) Continuation of application No. 17/649,548, filed on Jan. 31, 2022, now Pat. No. 11,737,299, which is a
(Continued)

(30) Foreign Application Priority Data

Oct. 28, 2015  (KR) .................. 10-2015-0150266

(51) Int. Cl.
  *H10K 50/13*  (2023.01)
  *H10K 50/11*  (2023.01)
  (Continued)

(52) U.S. Cl.
  CPC .......... *H10K 50/131* (2023.02); *H10K 50/11* (2023.02); *H10K 50/15* (2023.02); *H10K 50/17* (2023.02);
  (Continued)

(58) Field of Classification Search
  CPC ...... H10K 50/131; H10K 50/11; H10K 50/15; H10K 50/17; H10K 50/18; H10K 71/00;
  (Continued)

(56) References Cited

U.S. PATENT DOCUMENTS 6,288,487 B1   9/2001  Arai
7,829,205 B2  11/2010  Lee et al.
(Continued)

FOREIGN PATENT DOCUMENTS

CN        104576963 A  *  4/2015  ......... H01L 51/0037
KR   10-2001-0071269 A     7/2001
(Continued)

*Primary Examiner* — Michael M. Bernshteyn
(74) *Attorney, Agent, or Firm* — Lewis Roca Rothgerber Christie LLP

(57) ABSTRACT

An organic light-emitting device including: a first electrode; a second electrode facing the first electrode; a first emission unit and a second emission unit between the first electrode and the second electrode; and a first charge generation layer between the first emission unit and the second emission unit; wherein the first emission unit includes a first emission layer and a first inorganic buffer layer, and the second emission unit includes a second emission layer and a second inorganic buffer layer.

19 Claims, 1 Drawing Sheet

Related U.S. Application Data continuation of application No. 16/852,171, filed on Apr. 17, 2020, now Pat. No. 11,264,583, which is a division of application No. 16/417,426, filed on May 20, 2019, now Pat. No. 10,665,810, which is a continuation of application No. 16/005,169, filed on Jun. 11, 2018, now Pat. No. 10,305,059, which is a continuation of application No. 15/173,336, filed on Jun. 3, 2016, now Pat. No. 9,997,733.

(51) Int. Cl.
| | | |
|---|---|---|
| *H10K 50/15* | (2023.01) | |
| *H10K 50/17* | (2023.01) | |
| *H10K 50/18* | (2023.01) | |
| *H10K 71/00* | (2023.01) | |
| *H10K 85/30* | (2023.01) | |
| *H10K 85/60* | (2023.01) | |
| *H10K 101/10* | (2023.01) | |
| *H10K 102/00* | (2023.01) | |

(52) U.S. Cl.
CPC ............ *H10K 50/18* (2023.02); *H10K 71/00* (2023.02); *H10K 85/30* (2023.02); *H10K 85/324* (2023.02); *H10K 85/341* (2023.02); *H10K 85/342* (2023.02); *H10K 85/346* (2023.02); *H10K 85/348* (2023.02); *H10K 85/381* (2023.02); *H10K 85/60* (2023.02); *H10K 85/615* (2023.02); *H10K 85/622* (2023.02); *H10K 85/623* (2023.02); *H10K 85/624* (2023.02); *H10K 85/626* (2023.02); *H10K 85/631* (2023.02); *H10K 85/633* (2023.02); *H10K 85/636* (2023.02); *H10K 85/653* (2023.02); *H10K 85/654* (2023.02); *H10K 85/657* (2023.02); *H10K 85/6572* (2023.02); *H10K 85/6574* (2023.02); *H10K 85/6576* (2023.02); *H10K 2101/10* (2023.02); *H10K 2102/00* (2023.02)

(58) Field of Classification Search
CPC .. H10K 85/324; H10K 85/341; H10K 85/342; H10K 85/346; H10K 85/348; H10K 85/281; H10K 85/615; H10K 85/622; H10K 85/623; H10K 85/624; H10K 85/626; H10K 85/631; H10K 85/633; H10K 85/636; H10K 85/653; H10K 85/654; H10K 85/657; H10K 85/6572; H10K 85/6574; H10K 85/6576; H10K 2101/10; H10K 2102/00
USPC .......................................................... 257/40
See application file for complete search history.

(56) References Cited

U.S. PATENT DOCUMENTS

| | | | |
|---|---|---|---|
| 9,203,034 B2 * | 12/2015 | Kho | H10K 85/636 |
| 2003/0224203 A1 * | 12/2003 | Raychaudhuri | H10K 50/82 |
| | | | 313/506 |
| 2006/0147752 A1 | 7/2006 | Lee et al. | |
| 2009/0001878 A1 | 1/2009 | Qiu et al. | |
| 2009/0167159 A1 * | 7/2009 | Song | H10K 50/17 |
| | | | 313/504 |
| 2010/0052522 A1 | 3/2010 | Kim et al. | |
| 2013/0153865 A1 * | 6/2013 | Kho | H10K 85/636 |
| | | | 257/E51.026 |
| 2015/0060825 A1 | 3/2015 | Song et al. | |
| 2015/0144897 A1 | 5/2015 | Kang et al. | |

FOREIGN PATENT DOCUMENTS

| | | | |
|---|---|---|---|
| KR | 10-2006-0078358 A | | 7/2006 |
| KR | 10-2007-0024036 A | | 3/2007 |
| KR | 20070024036 A | * | 3/2007 |
| KR | 10-2008-0090350 A | | 10/2008 |
| KR | 10-2009-0072447 A | | 7/2009 |
| KR | 10-0906782 B1 | | 7/2009 |
| KR | 10-2010-0026106 A | | 3/2010 |
| KR | 10-2010-0062579 A | | 6/2010 |
| KR | 10-1030008 B1 | | 4/2011 |
| KR | 10-2013-0135161 A | | 12/2013 |
| KR | 10-2015-0000061 B1 | | 1/2015 |
| KR | 10-2015-0025727 A | | 3/2015 |
| KR | 20130074816 A | * | 4/2015 |

* cited by examiner

10

| 190 |
|-----|
| 170 |
| 150 |
| 130 |
| 110 |

ORGANIC LIGHT-EMITTING DEVICE

CROSS-REFERENCE TO RELATED APPLICATION

This application is a continuation of U.S. patent application Ser. No. 17/649,548, filed Jan. 31, 2022, now U.S. Pat. No. 11,737,299, issued Aug. 22, 2023, which is a continuation of U.S. patent application Ser. No. 16/852,171, filed Apr. 17, 2020, now U.S. Pat. No. 11,264,583, issued Mar. 1, 2022, which is a divisional of U.S. patent application Ser. No. 16/417,426, filed May 20, 2019, now U.S. Pat. No. 10,665,810, issued May 26, 2020, which is a continuation of U.S. patent application Ser. No. 16/005,169, filed Jun. 11, 2018, now U.S. Pat. No. 10,305,059, issued May 28, 2019, which is a continuation of U.S. patent application Ser. No. 15/173,336, filed Jun. 3, 2016, now U.S. Pat. No. 9,997,733, issued Jun. 12, 2018, which claims priority to and the benefit of Korean Patent Application No. 10-2015-0150266, filed Oct. 28, 2015, the entire content of all of which is incorporated herein by reference.

BACKGROUND

1. Field

One or more aspects of example embodiments of the present disclosure are related to an organic light-emitting device.

2. Description of the Related Art

Organic light-emitting devices are self-emission devices that have wide viewing angles, high contrast ratios, short response times, and/or excellent brightness, driving voltage, and/or response speed characteristics, and may produce full-color images.

An organic light-emitting device may include a first electrode on a substrate, and a hole transport region, an emission layer, an electron transport region, and a second electrode sequentially positioned on the first electrode. Holes provided from the first electrode may move toward the emission layer through the hole transport region, and electrons provided from the second electrode may move toward the emission layer through the electron transport region. Carriers (such as holes and electrons) may recombine in the emission layer to produce excitons. These excitons may change (e.g., transition or radiatively decay) from an excited state to the ground state to thereby generate light.

SUMMARY

One or more aspects of example embodiments of the present disclosure are directed toward an organic light-emitting device having high efficiency and a long lifespan.

Additional aspects will be set forth in part in the description which follows and, in part, will be apparent from the description, or may be learned by practice of the presented embodiments.

One or more example embodiments of the present disclosure provide an organic light-emitting device including:
a first electrode;
a second electrode facing the first electrode;
a first emission unit and a second emission unit between the first electrode and the second electrode; and
a first charge generation layer between the first emission unit and the second emission unit;
wherein the first emission unit includes a first emission layer and a first inorganic buffer layer, and the second emission unit includes a second emission layer and a second inorganic buffer layer.

BRIEF DESCRIPTION OF THE DRAWING

These and/or other aspects will become apparent and more readily appreciated from the following description of the embodiments, taken in conjunction with the drawing, which is a schematic cross-sectional diagram illustrating the structure of an organic light-emitting device according to an embodiment of the present disclosure.

DETAILED DESCRIPTION

Reference will now be made in more detail to embodiments, examples of which are illustrated in the accompanying drawing, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described below, by referring to the drawing, to explain aspects of the present description. Expressions such as "at least one of", "one of", "selected from", "at least one selected from", and "one selected from", when preceding a list of elements, modify the entire list of elements and do not modify the individual elements of the list.

The thicknesses of layers, films, panels, regions, etc., may be exaggerated in the drawings for clarity. It will be understood that when an element such as a layer, film, region, or substrate is referred to as being "on" another element, it can be directly on the other element or intervening element(s) may also be present. In contrast, when an element is referred to as being "directly on" another element, no intervening elements are present.

The drawing is a schematic cross-sectional diagram illustrating the structure of an organic light-emitting device 10 according to an embodiment of the present disclosure. The organic light-emitting device 10 includes a first electrode 110, a first emission unit 130, a first charge generation layer 150, a second emission unit 170, and a second electrode 190.

In the organic light-emitting device 10, the first electrode 110 may be an anode, and the second electrode 190 may be a cathode.

In one embodiment, the organic light-emitting device 10 may have a structure including: a first electrode 110; a second electrode 190 facing the first electrode 110; a first emission unit 130 and a second emission unit 170 between the first electrode 110 and the second electrode 190; and a first charge generation layer 150 between the first emission unit 130 and the second emission unit 170, wherein the first emission unit 130 may include a first emission layer and a first inorganic buffer layer, and the second emission unit 170 may include a second emission layer and a second inorganic buffer layer.

In some embodiments, the first emission unit 130 may further include a first hole injection layer between the first emission layer and the first electrode 110, and the first inorganic buffer layer may be between the first emission layer and the first hole injection layer; the second emission unit 170 may further include a second hole injection layer between the second emission layer and the first charge generation layer 150, and the second inorganic buffer layer may be between the second emission layer and the second hole injection layer.

For example, the first inorganic buffer layer may be directly in contact with the first emission layer, and the second inorganic buffer layer may be directly in contact with the second emission layer.

Hereinafter, a structure and a method of manufacturing the organic light-emitting device 10 according to an embodiment of the present disclosure will be described with reference to the drawing.

A substrate may be under the first electrode 110 and/or above the second electrode 190. The substrate may be a glass substrate or a transparent plastic substrate, each having excellent mechanical strength, thermal stability, transparency, surface smoothness, ease of handling, and/or water-resistance.

The first electrode 110 may be formed by, for example, depositing and/or sputtering a material for forming the first electrode 110 on the substrate. The first electrode 110 may be an anode, and in this case, the material for forming the first electrode 110 may be selected from materials with a high work function to facilitate hole injection. The first electrode 110 may be a reflective electrode, a semi-transmissive electrode, or a transmissive electrode. The material for forming the first electrode 110 may be a transparent and/or highly conductive material (such as indium tin oxide (ITO), indium zinc oxide (IZO), tin oxide ($SnO_2$), and/or zinc oxide (ZnO)). When the first electrode 110 is a semi-transmissive electrode or a reflective electrode, the material for forming the first electrode 110 may include at least one selected from magnesium (Mg), aluminum (Al), aluminum-lithium (Al—Li), calcium (Ca), magnesium-indium (Mg—In), and magnesium-silver (Mg—Ag).

The first electrode 110 may have a single-layer structure or a multi-layer structure including a plurality of layers. For example, the first electrode 110 may have a three-layered structure of ITO/Ag/ITO, but embodiments of the structure are not limited thereto.

The first emission unit 130, the first charge generation layer 150, and the second emission unit 170 may be sequentially stacked in this stated order on the first electrode 110.

The first charge generation layer 150 may control or manage the charge balance between the first emission unit 130 and the second emission unit 170, which are adjacent to one another. In this regard, the first charge generation layer 150 may be also referred to as an intermediate connector layer (ICL).

The first charge generation layer 150 may be between the first emission unit 130 and the second emission unit 170. As used herein, the term "adjacent" may refer to a case in which two layers are physically in contact with each other, or a case in which an undescribed layer is between the two layers.

In some embodiments, the first charge generation layer 150 may include an n-charge generation layer and a p-charge generation layer. The n-charge generation layer may include an n-type dopant, and the p-charge generation layer may include a p-type dopant. The n-charge generation layer may be positioned closer to the first electrode 110 than the p-charge generation layer.

The first emission unit 130 may include a first emission layer and a first inorganic buffer layer, and the second emission unit 170 may include a second emission layer and a second inorganic buffer layer.

The first and second inorganic buffer layers may each include a metal halide.

For example, the first and second inorganic buffer layers may each include at least one halide compound selected from an alkali metal halide, an alkaline earth metal halide, a transition metal halide, a post-transition metal halide, and a lanthanum-based metal halide.

In some embodiments, the first and second inorganic buffer layers may each include at least one iodide compound selected from an alkali metal iodide, an alkaline earth metal iodide, a transition metal iodide, a post-transition metal iodide, and a lanthanum-based metal iodide.

In some embodiments, the first and second inorganic buffer layers may each include at least one iodide compound selected from a lithium (Li) iodide, a sodium (Na) iodide, a potassium (K) iodide, a rubidium (Rb) iodide, a cesium (Cs) iodide, a beryllium (Be) iodide, a Mg iodide, a Ca iodide, a strontium (Sr) iodide, a barium (Ba) iodide, a ytterbium (Yb) iodide, a samarium (Sm) iodide, a copper (Cu) iodide, a thallium (Tl) iodide, a Ag iodide, a cadmium (Cd) iodide, a mercury (Hg) iodide, a tin (Sn) iodide, a lead (Pb) iodide, a bismuth (Bi) iodide, a zinc (Zn) iodide, a manganese (Mn) iodide, an iron (Fe) iodide, a cobalt (Co) iodide, a nickel (Ni) iodide, an Al iodide, an indium (In) iodide, a gallium (Ga) iodide, a thorium (Th) iodide, and a uranium (U) iodide, but embodiments of the first and second inorganic buffer layers are not limited thereto.

In some embodiments, the first and second inorganic buffer layers may each include at least one iodide compound selected from LiI, NaI, KI, RbI, CsI, $BeI_2$, $MgI_2$, $CaI_2$, $SrI_2$, $BaI_2$, YbI, $YbI_2$, $YbI_3$, $SmI_3$, CuI, TlI, AgI, $CdI_2$, $HgI_2$, $SnI_2$, $PbI_2$, $BiI_3$, $ZnI_2$, $MnI_2$, $FeI_2$, $COI_2$, $NiI_2$, $AlI_3$, $InI_3$, $GaI_3$, $ThI_4$, and $UL_3$, but embodiments of the first and second inorganic buffer layers are not limited thereto.

In some embodiments, the first and second inorganic buffer layers may each include a metal halide.

In some embodiments, the first and second inorganic buffer layers may each include at least one halide compound selected from an alkali metal halide, an alkaline earth metal halide, a transition metal halide, a post-transition metal halide, and a lanthanum-based metal halide, and may further include at least one metal. However, embodiments of the first and second inorganic buffer layers are not limited thereto.

For example, the first and second inorganic buffer layers may each further include at least one metal selected from an alkali metal, an alkaline earth metal, a transition metal, a post-transition metal, and a lanthanum-based metal, but embodiments of the first and second inorganic buffer layers are not limited thereto.

In some embodiments, the first and second inorganic buffer layers may each further include at least one metal selected from Li, Na, K, Rb, Cs, Be, Mg, Ca, Sr, Ba, Yb, Sm, Cu, Tl, Ag, Cd, Hg, Sn, Pb, Bi, Zn, Mn, Fe, Co, Ni, Al, In, Ga, Th, and U.

In some embodiments, the first and second inorganic buffer layers may each include a metal halide and a metal.

For example, the first and second inorganic buffer layers may each include a halide compound of a first metal in addition to a second metal, wherein the first metal is identical to the second metal.

In some embodiments, the first and second inorganic buffer layers may each include a halide compound of a first metal in addition to a second metal, wherein the first metal is different from the second metal.

The first and second inorganic buffer layers may each have a thickness of about 1 nm to about 20 nm, and in some embodiments, about 5 nm to about 10 nm. When the thicknesses of the first and second inorganic buffer layers are within these ranges, the organic light-emitting device 10 may achieve high efficiency.

In some embodiments, the organic light-emitting device 10 may further include a third emission unit between the first electrode 110 and the second electrode 190, and a second charge generation layer between the second emission unit 170 and the third emission unit. The third emission unit may include a third emission layer and a third inorganic buffer layer, and the third inorganic buffer layer may include at least one iodide compound selected from an alkali metal iodide, an alkaline earth metal iodide, a transition metal iodide, a post-transition metal iodide, and a lanthanum-based metal iodide.

In some embodiments, the first emission unit 130 may further include a first electron transport region between the first emission layer and the first charge generation layer 150, and the second emission unit 170 may further include a second electron transport region between the second emission layer and the second electrode 190.

The first emission unit 130 may include the first emission layer, the first inorganic buffer layer, and an organic layer; and the second emission unit 170 may include the second emission layer, the second inorganic buffer layer, and an organic layer.

The organic light-emitting device 10 may include the first emission unit 130 and the second emission unit 170 between the first electrode 110 and the second electrode 190, and the first charge generation layer 150 between the first emission unit 130 and the second emission unit 170, wherein the first emission unit 130 may include the first emission layer and the first inorganic buffer layer, and the second emission unit 170 may include the second emission layer and the second inorganic buffer layer.

In the organic light-emitting device 10, the first emission unit 130 may include a first hole transport layer, and the second emission unit 170 may include a second hole transport layer.

In the organic light-emitting device 10, the first emission unit 130 may include a first inorganic buffer layer, and the second emission unit 170 may include a second inorganic buffer layer. In this regard, during movement of holes from the first hole transport layer to the first emission layer and holes from the second hole transport layer to the second emission layer, an undesirable flow of electrons may be blocked or reduced, thereby preventing or reducing recombination of the holes and the electrons in non-emission layers, thereby preventing or reducing deterioration of materials, and increasing the efficiency of the organic light-emitting device 10. In some embodiments, the first inorganic buffer layer between the first emission layer and the first hole transport layer and the second inorganic buffer layer between the second emission layer and the second hole transport layer may each serve as an electron trap layer and/or a hole injection layer. Such a hole injection layer may include an alkali metal iodide and/or an alkali earth metal iodide, each having high reactivity, a wide band gap, and strong dipole characteristics, in order to increase hole injection efficiency associated with blocking of electrons, trapping of outgassing elements, and tunneling of dipole layers (e.g., dipole layer-induced enhancement of hole tunneling effects). Accordingly, the organic light-emitting device 10 may have increased efficiency and high reliability.

The organic layer included in the first emission unit may further include a first hole transport region between the first electrode 110 and the first emission layer and a first electron transport region between the first emission layer and the first charge generation layer 150. In some embodiments, the organic layer included in the second emission unit may further include a second hole transport region between the first charge generation layer 150 and the second emission layer and a second electron transport region between the second emission layer and the second electrode 190.

The first hole transport region, the first emission layer, the first electron transport region, the second hole transport region, the second emission layer, and the second electron transport region will be described in more detail.

The first and second hole transport regions may each include at least one layer selected from a hole injection layer (HIL), a hole transport layer (HTL), a buffer layer, and an electron blocking layer (EBL). The first and second electron transport regions may each include at least one layer selected from a hole blocking layer (HBL), an electron transport layer (ETL), and an electron injection layer (EIL). However, embodiments of the layers are not limited thereto.

The first and second hole transport regions may each have a single-layer structure including a single material, a single-layer structure including a plurality of different materials, or a multi-layer structure including a plurality of layers formed of a plurality of different materials.

For example, the first and second hole transport regions may each have a single-layer structure including a plurality of different materials, a structure of HIL/HTL, a structure of HIL/HTL/buffer layer, a structure of HIL/buffer layer, a structure of HTL/buffer layer, or a structure of HIL/HTL/EBL, wherein layers of each structure are sequentially stacked in each stated order on the first electrode 110. However, embodiments of the structure are not limited thereto.

When the first and second hole transport regions each include an HIL, the HIL may be formed on the first electrode 110 using one or more suitable methods selected from vacuum deposition, spin coating, casting, a Langmuir-Blodgett (LB) method, ink-jet printing, laser-printing, and laser-induced thermal imaging (LITI).

When the HIL is formed by vacuum deposition, the vacuum deposition may be performed at a deposition temperature of about 100° C. to about 500° C., a vacuum degree of about $10^{-8}$ torr to about $10^{-3}$ torr, and a deposition rate of about 0.01 Å/sec to about 100 Å/sec, depending on the compound to be deposited in the HIL and the structure of the desired HIL.

When the HIL is formed by spin coating, the spin coating may be performed at a coating rate of about 2,000 rpm to about 5,000 rpm and at a heat treatment temperature of about 80° C. to about 200° C., depending on the compound to be deposited in the HIL and the structure of the desired HIL.

When the first and second hole transport regions each include an HTL, the HTL may be formed on the first electrode 110 or on the HIL using one or more suitable methods selected from vacuum deposition, spin coating, casting, an LB method, ink-jet printing, laser-printing, and LITI. When the HTL is formed by vacuum deposition and/or spin coating, the deposition and coating conditions may be similar to the conditions used for forming the HIL.

The first and second hole transport regions may each include, for example, at least one selected from m-MTDATA, TDATA, 2-TNATA, NPB, β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, and a compound represented by Formula 202:

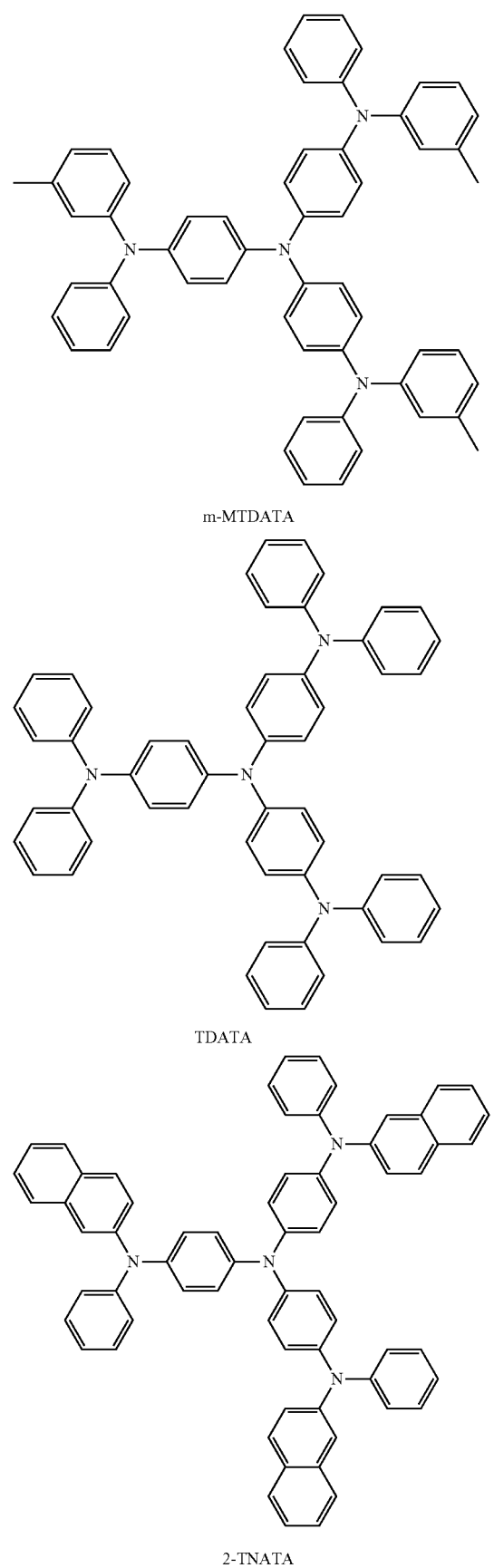
m-MTDATA
TDATA
2-TNATA
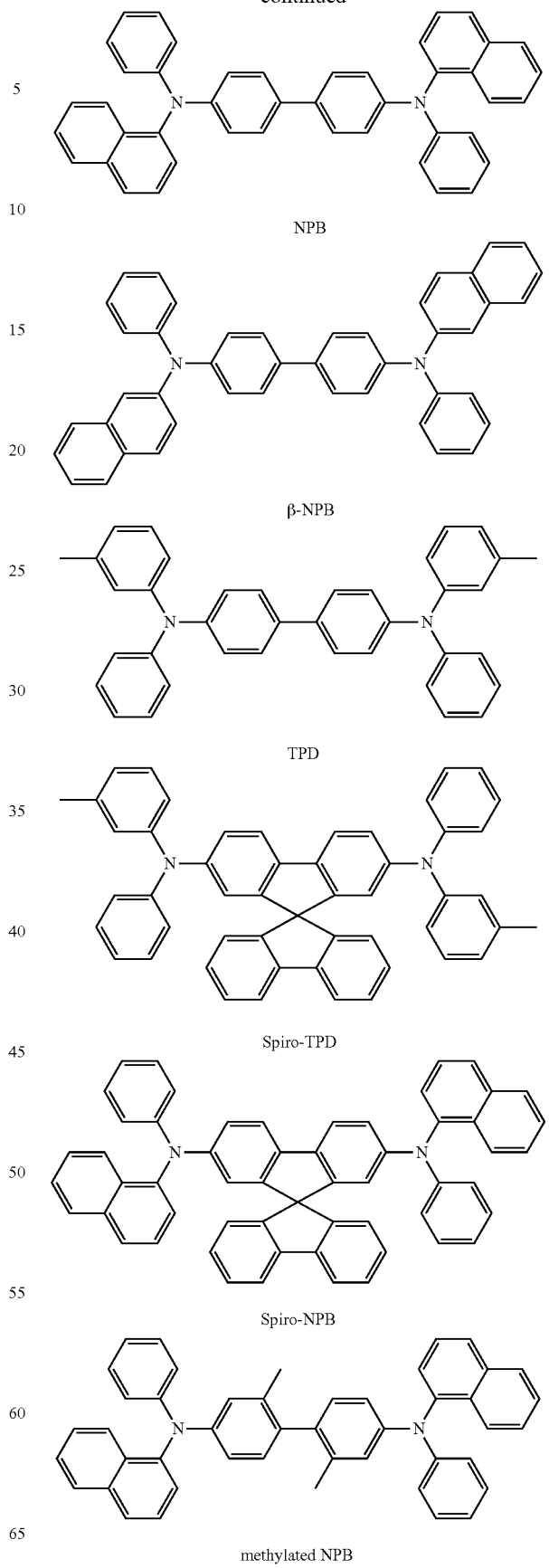
NPB
β-NPB
TPD
Spiro-TPD
Spiro-NPB
methylated NPB -continued

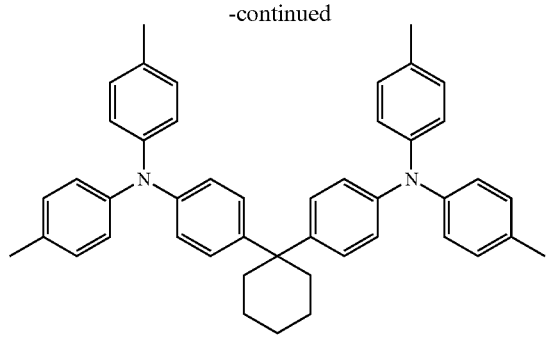

TAPC

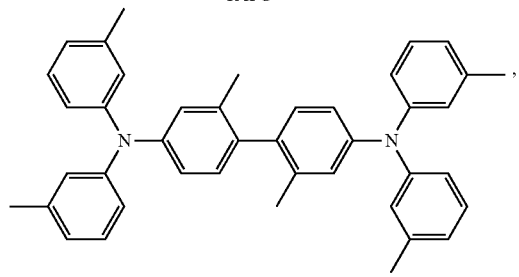

HMTPD

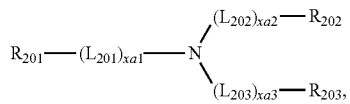

Formula 201

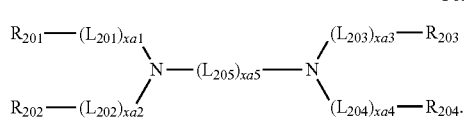

Formula 202

In Formulae 201 and 202,
$L_{201}$ to $L_{205}$ may each be independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each be independently selected from 0, 1, 2, and 3, xa5 may be selected from 1, 2, 3, 4, and 5, and $R_{201}$ to $R_{204}$ may each be independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formulae 201 and 202,
$L_{201}$ to $L_{205}$ may each be independently selected from the group consisting of:
a phenylene group, a naphthylene group, a fluorenylene group, a spiro-bifluorenylene group, a benzofluorene group, a dibenzofluorene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, a triazinylene group; and
a phenylene group, a naphthylene group, a fluorenylene group, a spiro-bifluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group, xa1 to xa4 may each be independently selected from 0, 1, and 2, xa5 may be selected from 1, 2, and 3, and $R_{201}$ to $R_{204}$ may each be independently selected from the group consisting of:
a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group; and
a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, an azulenyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but embodiments of the present disclosure are not limited thereto.

The compound represented by Formula 201 may be represented by Formula 201A:

Formula 201A

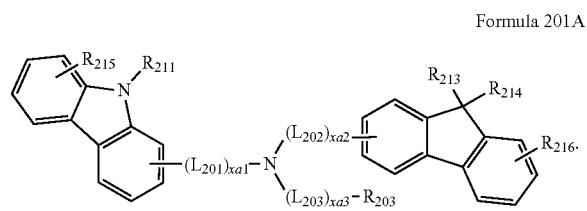

For example, the compound represented by Formula 201 may be represented by Formula 201A-1, but embodiments of the present disclosure are not limited thereto:

Formula 201A-1

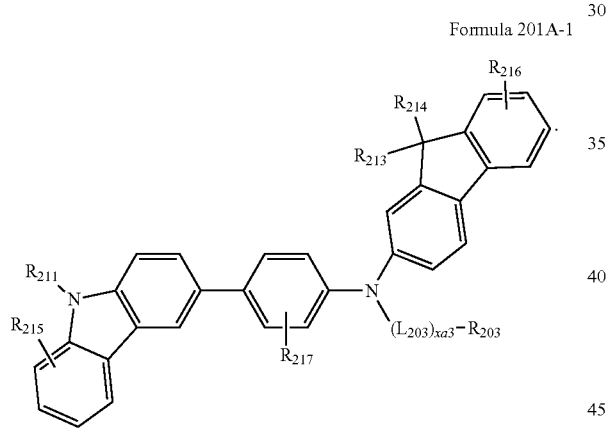

The compound represented by Formula 202 may be represented by Formula 202A, but embodiments of the present disclosure are not limited thereto:

Formula 202A

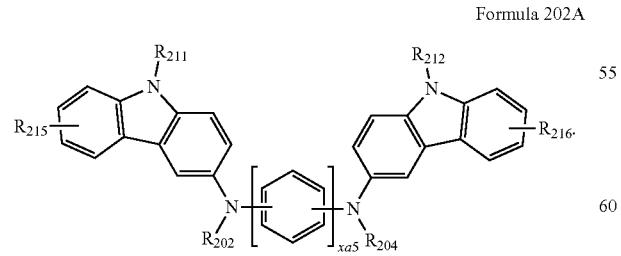

In Formulae 201A, 201A-1, and 202A, $L_{201}$ to $L_{203}$, xa1 to xa3, xa5, and $R_{202}$ to $R_{204}$ may each be the same as described herein in connection with Formula 201, $R_{211}$ and $R_{212}$ may each be the same as described herein in connection with $R_{203}$, and $R_{213}$ to $R_{217}$ may each be independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

The compound represented by Formula 201 and the compound represented by Formula 202 may each independently be or include one selected from Compounds HT1 to HT20, but embodiments of the present disclosure are not limited thereto:

HT1

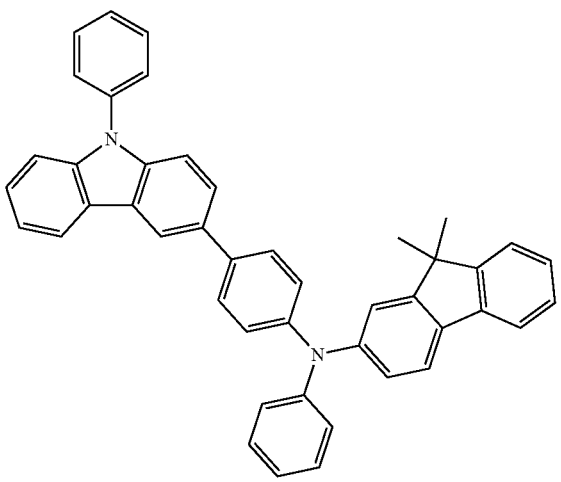

HT2

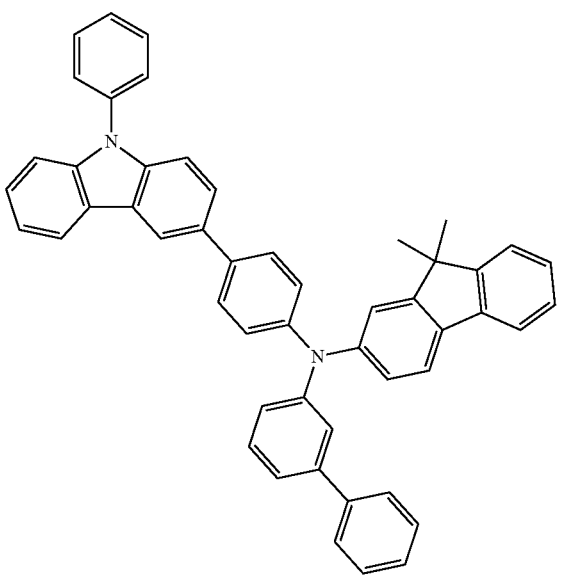

HT3
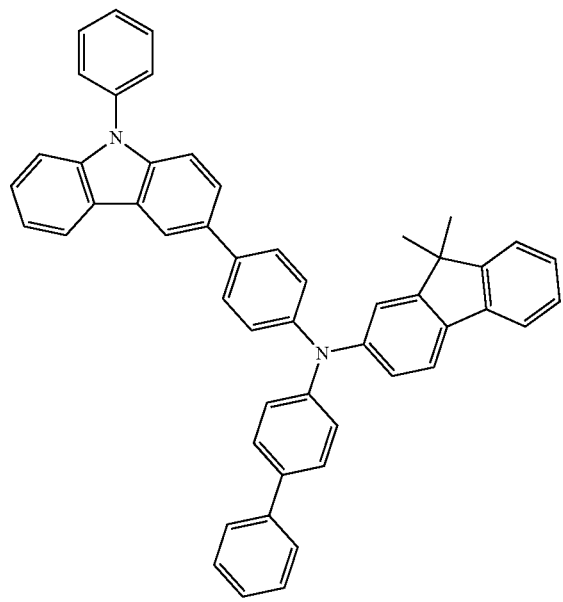
HT5
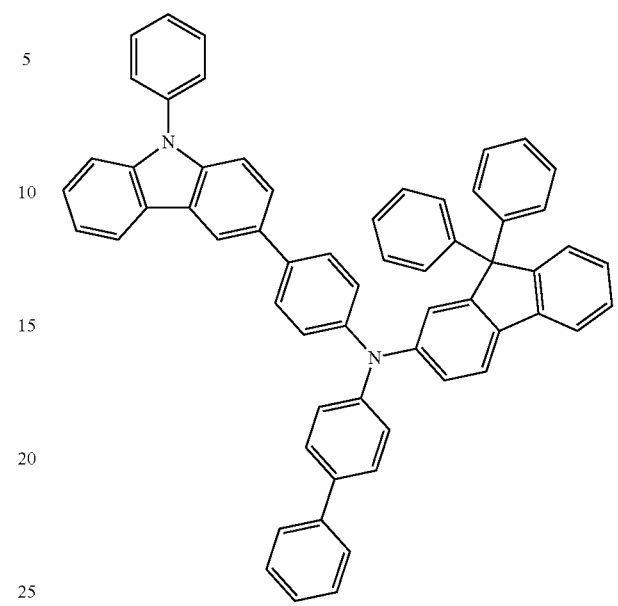
HT4
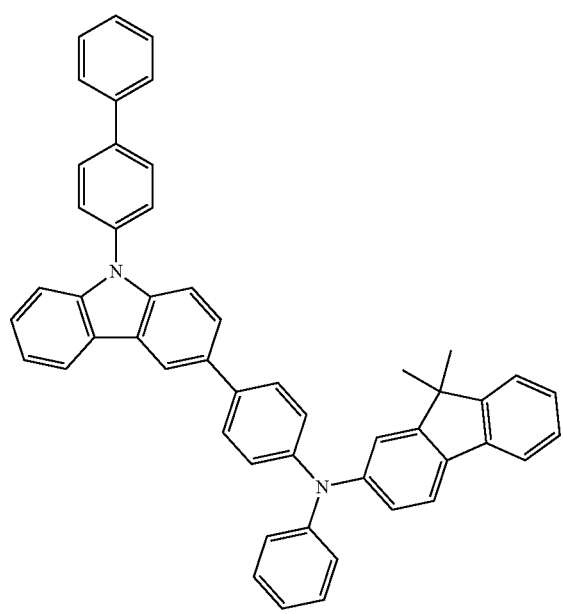
HT6
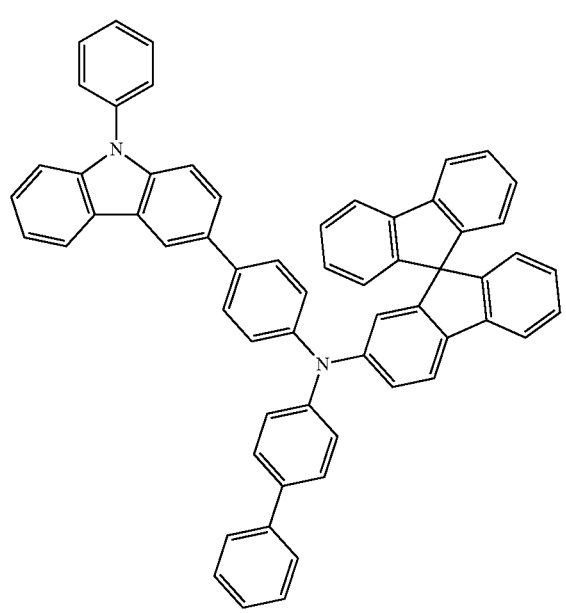

HT7
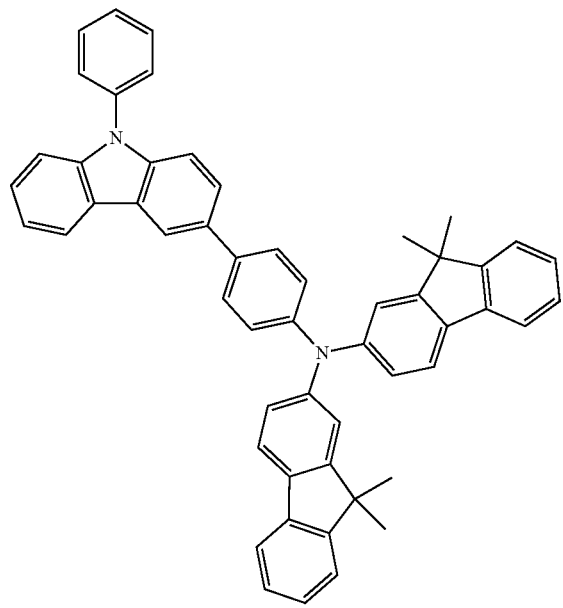
HT9
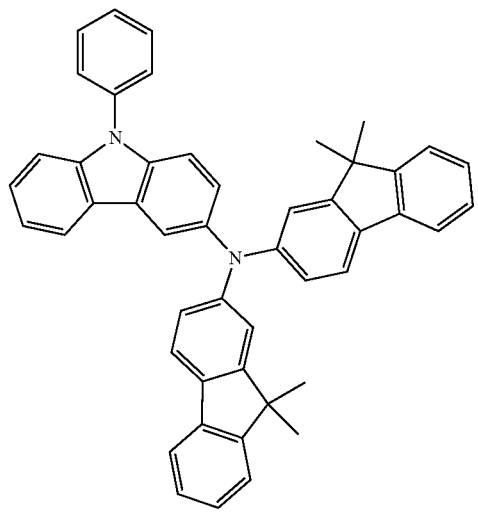
HT8
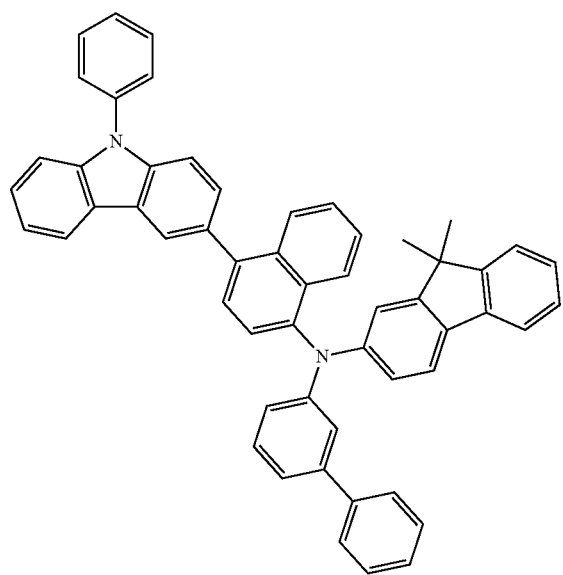
HT10
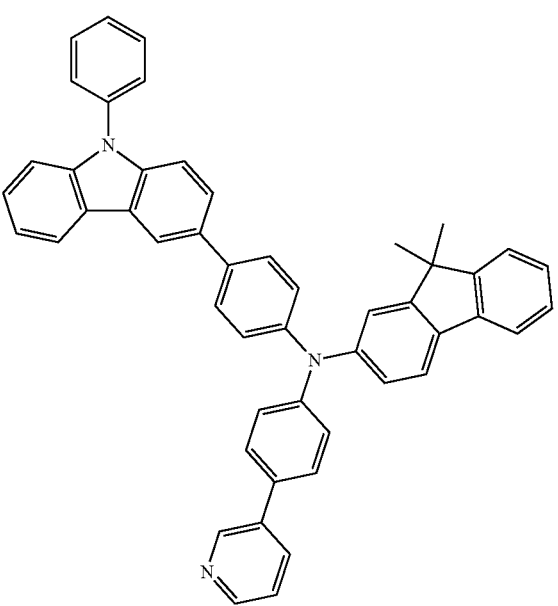

HT11
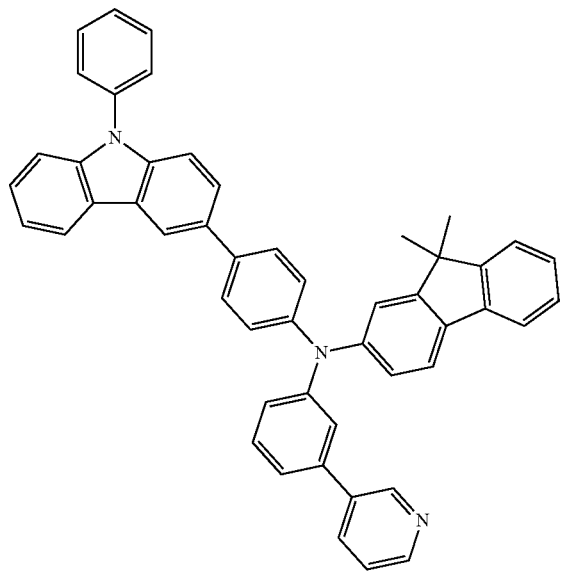
HT12
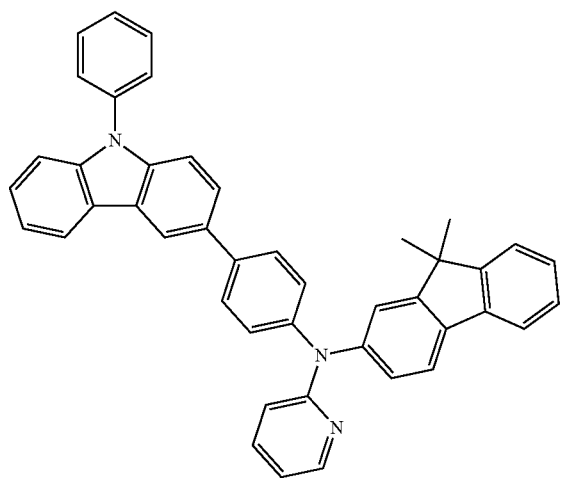
HT13
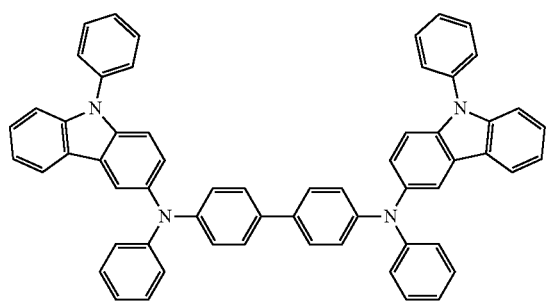
HT14
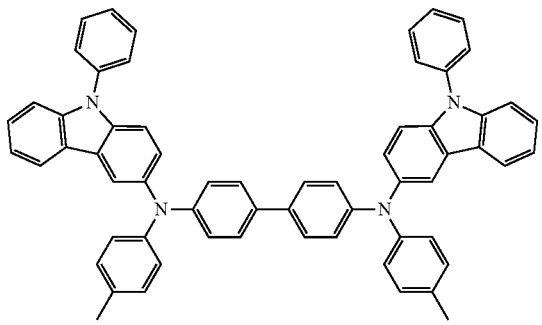
HT15
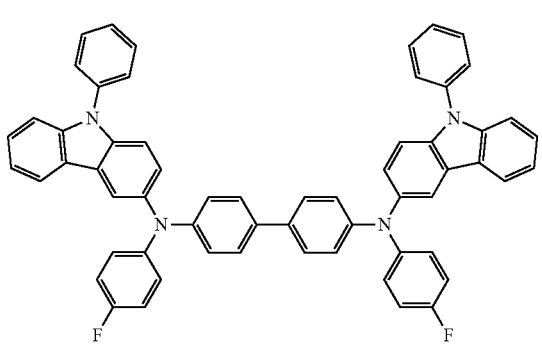
HT16
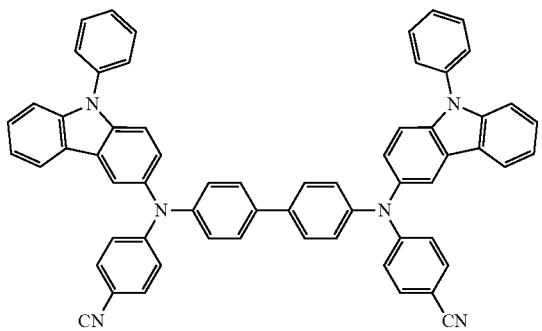
HT17
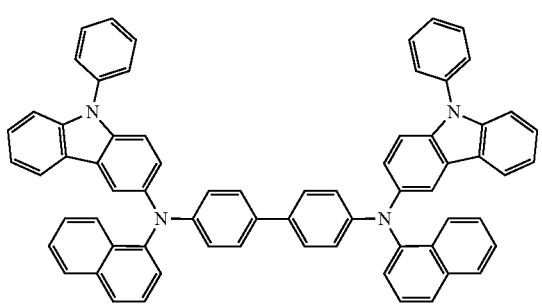

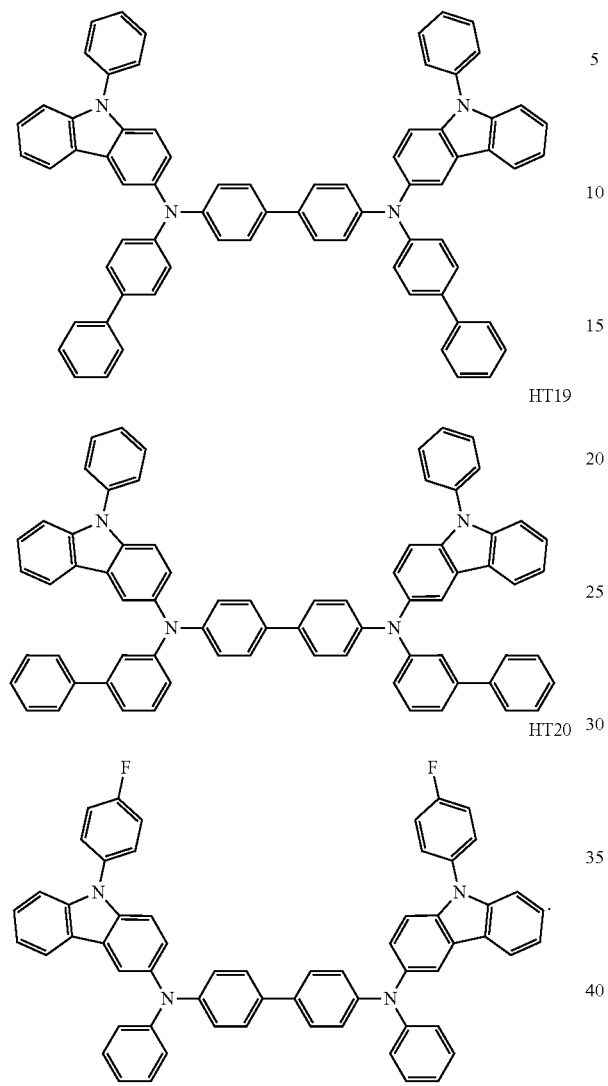

HT18

HT19

HT20

The thickness of the first and second hole transport regions may be about 100 Å to about 10,000 Å, and in some embodiments, about 100 Å to about 1,000 Å. When the first and second hole transport regions each include at least one selected from an HIL and an HTL, the thickness of the HIL may be about 100 Å to about 10,000 Å, and in some embodiments, about 100 Å to about 1,000 Å. The thickness of the HTL may be about 50 Å to about 2,000 Å, and in some embodiments, about 100 Å to about 1,500 Å. When the thicknesses of the first and second hole transport regions, the HIL, and the HTL are within these ranges, satisfactory hole transporting characteristics may be obtained without a substantial increase in driving voltage.

The first and second hole transport regions may each further include, in addition to these materials, a charge-generation material for the improvement of conductive properties. The charge-generation material may be homogeneously or non-homogeneously dispersed in the first and second hole transport regions.

The charge-generation material may be, for example, a p-dopant. The p-dopant may be one selected from a quinone derivative, a metal oxide, and a cyano group-containing compound, but embodiments of the charge-generation material are not limited thereto. Non-limiting examples of the p-dopant may include a quinone derivative (such as tetracyanoquinonedimethane (TCNQ) and/or 2,3,5,6-tetrafluoro-tetracyano-1,4-benzoquinonedimethane (F4-TCNQ)); a metal oxide (such as a tungsten oxide and/or a molybdenum oxide); and a cyano group-containing compound, (such as Compound HT-D1), but embodiments of the p-dopant are not limited thereto:

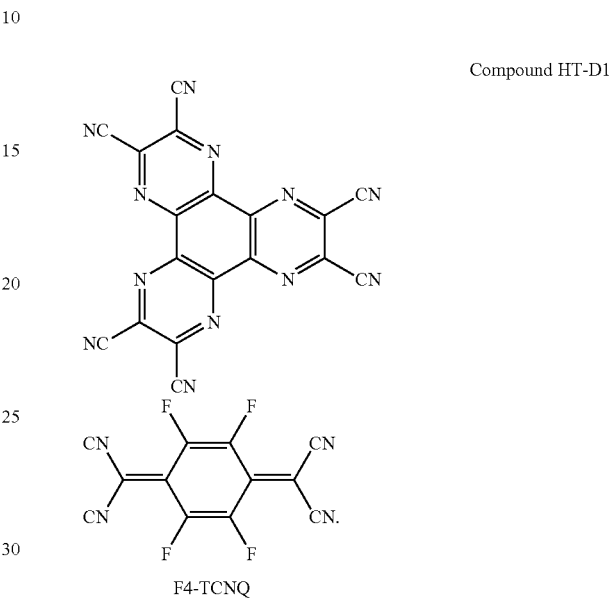

Compound HT-D1

F4-TCNQ

The first and second hole transport regions may each further include, in addition to the HIL and the HTL described above, at least one selected from a buffer layer and an electron blocking layer (EBL). The buffer layer may compensate for an optical resonance distance according to a wavelength of light emitted from the emission layer (e.g., be used to adjust the optical resonance distance to match the wavelength of light emitted from the emission layer), and thus, the efficiency of a formed organic light-emitting device may be improved. Any suitable material utilized in the first and second hole transport regions may also be included in the buffer layer. The EBL may prevent or reduce diffusive loss of electrons to the first and second electron transport regions.

The first and second emission layers may be formed on the first electrode 110 or on the first and second hole transport regions using one or more suitable methods selected from vacuum deposition, spin coating, casting, an LB method, ink-jet printing, laser-printing, and LITI. When the first and second emission layers are formed by vacuum deposition and/or spin coating, the deposition and coating conditions may be similar to the conditions used for forming the HIL.

When the organic light-emitting device 10 is a full-color organic light-emitting device, the first and second emission layers may each be patterned into a red emission layer, a green emission layer, and a blue emission layer according to each individual sub-pixel. Alternatively, the first and second emission layers may each have a multi-layer structure in which a red emission layer, a green emission layer, and a blue emission layer are stacked on one other, or a structure in which a red-light emitting material, a green-light emitting material, and a blue-light emitting material are mixed in the same layer to thereby emit white light.

The first and second emission layers may each include a host and a dopant.

The host may include at least one selected from TPBi, TBADN, ADN (also referred to as "DNA"), CBP, CDBP, and TCP:

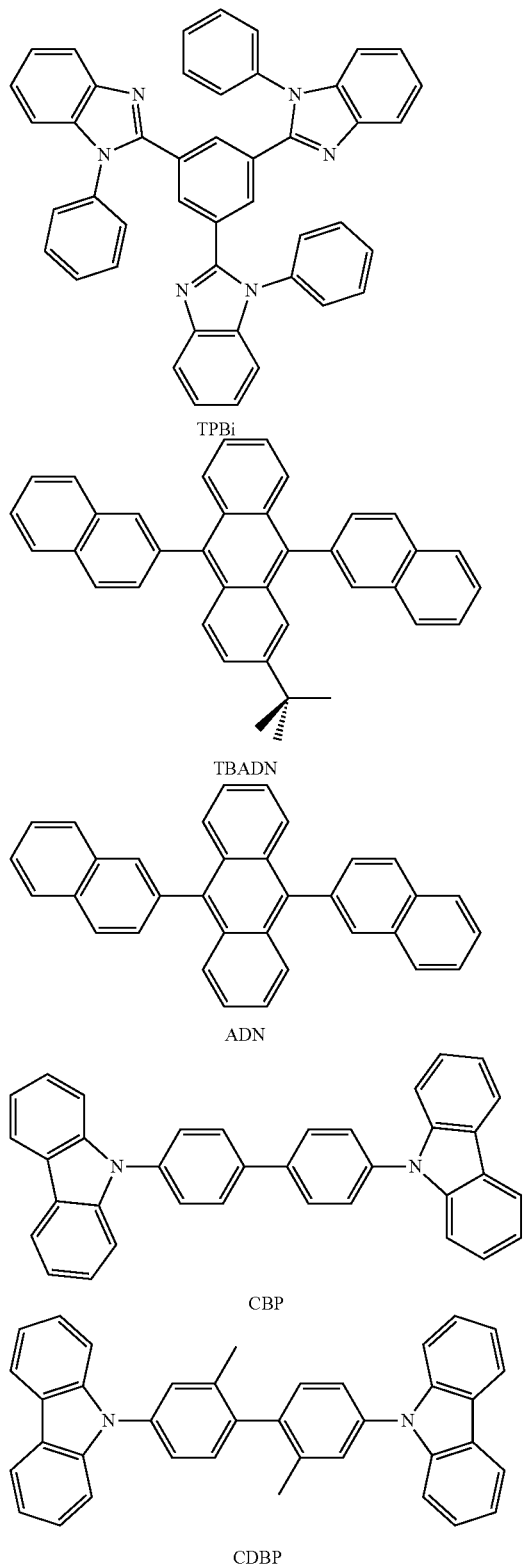

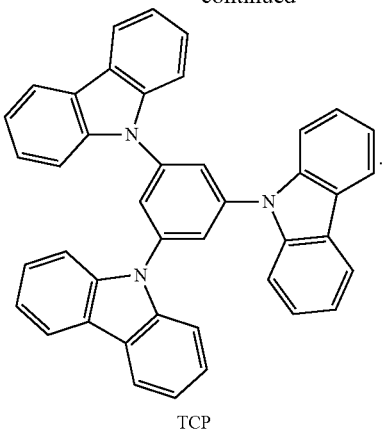

TCP

Alternatively, the host may include a compound represented by Formula 301:

$$Ar_{301}-[(L_{301})_{xb1}-R_{301}]_{xb2}.\qquad \text{Formula 301}$$

In Formula 301, $Ar_{301}$ may be selected from the group consisting of:
a naphthalene, a heptalene, a fluorenene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{301}$)($Q_{302}$)($Q_{303}$) (where $Q_{301}$ to $Q_{303}$ may each be independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group), $L_{301}$ may be the same as described herein in connection with $L_{201}$, $R_{301}$ may be selected from the group consisting of:
a $C_1$-$C_{20}$ alkyl group, a $C_1$-$C_{20}$ alkoxy group;
a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, xb1 may be selected from 0, 1, 2, and 3, and xb2 may be selected from 1, 2, 3, and 4.

For example, in Formula 301, $L_{301}$ may be selected from the group consisting of:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, and $R_{301}$ may be selected from the group consisting of:

a $C_1$-$C_{20}$ alkyl group, a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group; but embodiments of the present disclosure are not limited thereto.

For example, the host may include a compound represented by Formula 301A:

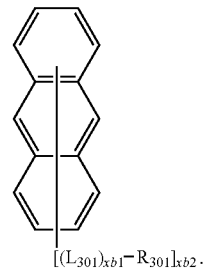

Formula 301A $[(L_{301})_{xb1}$-$R_{301}]_{xb2}$.

In Formula 301A, the substituents may each be the same as described herein in connection with Formula 301.

The compound represented by Formula 301 may be or include at least one selected from Compounds H1 to H42, but embodiments of the present disclosure are not limited thereto:

H1 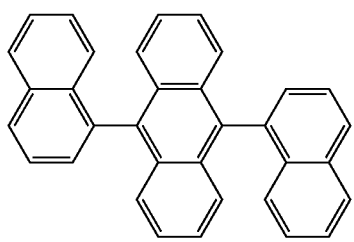
H2 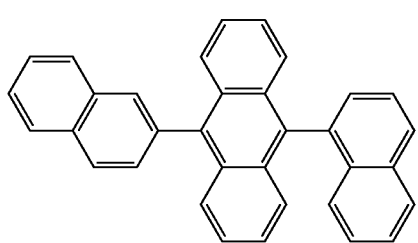
H3 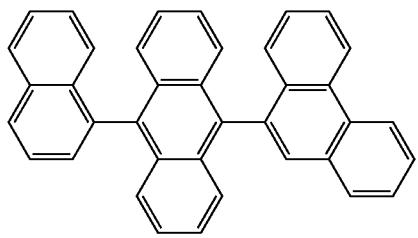
H4 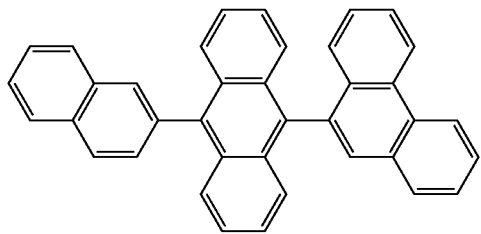
H5 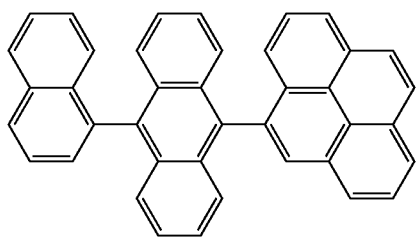
H6 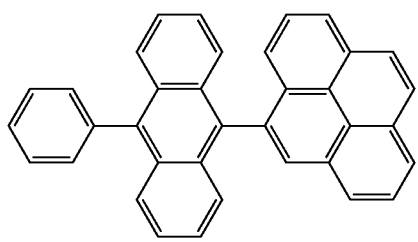
H7 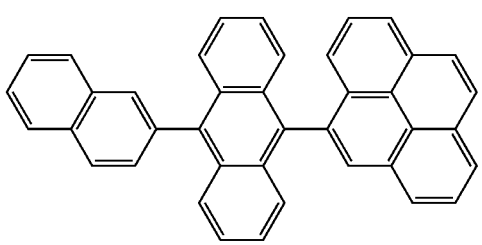
H8 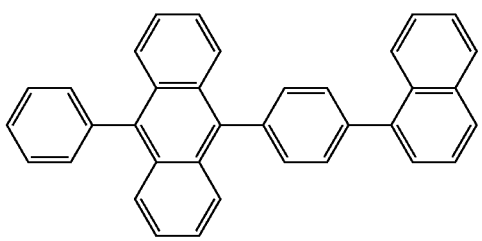
H9 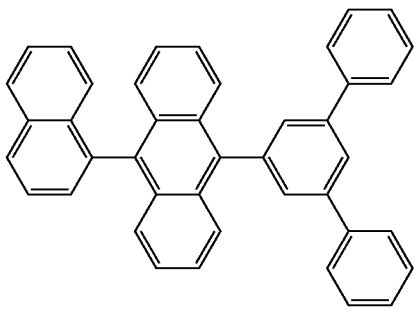
H10 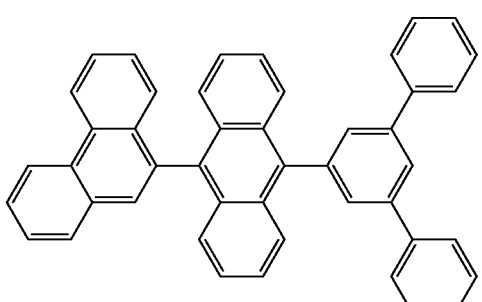
H11 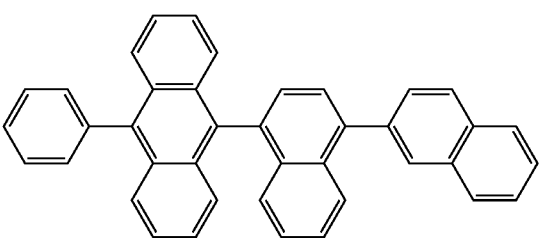
H12 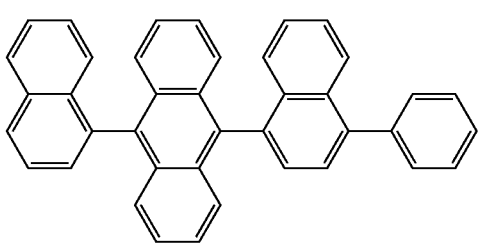

H13
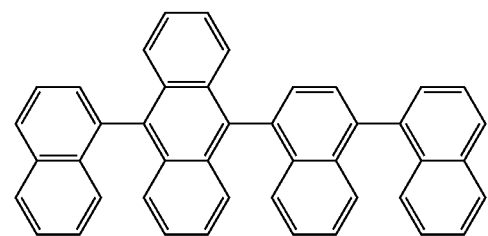
H14
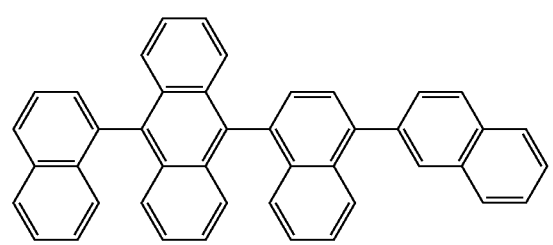
H15
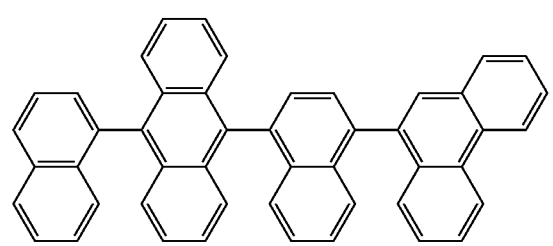
H16
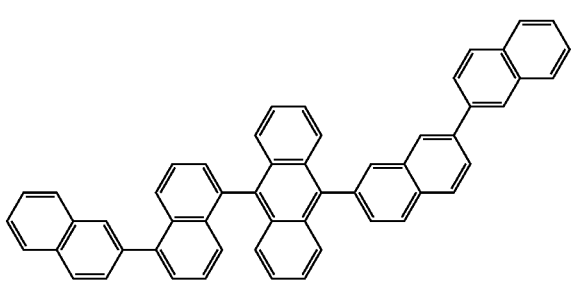
H17
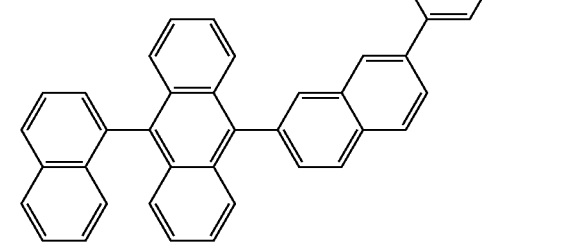
H18
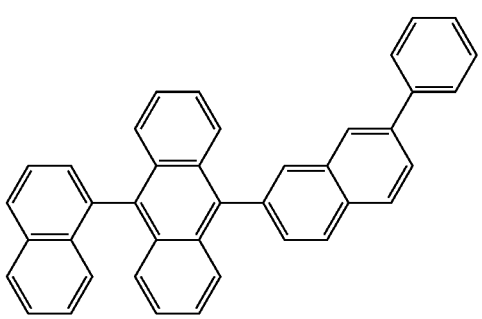
H19
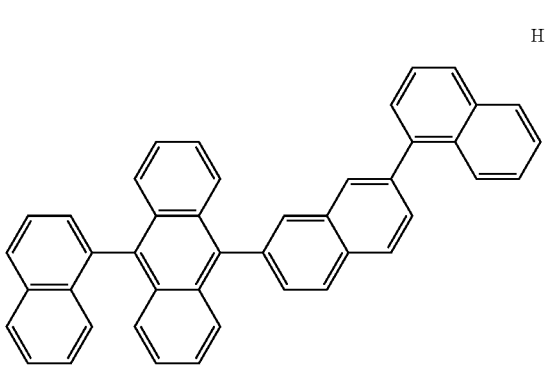
H20
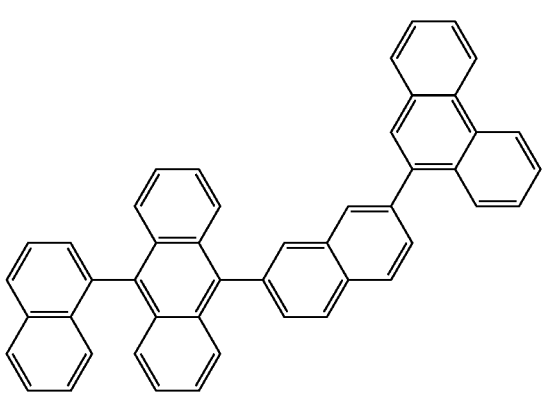
H21
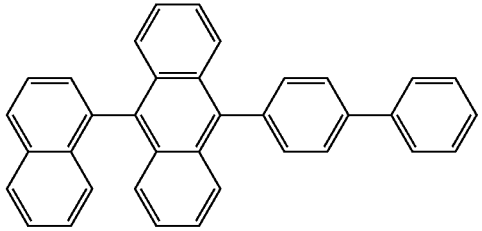
H22
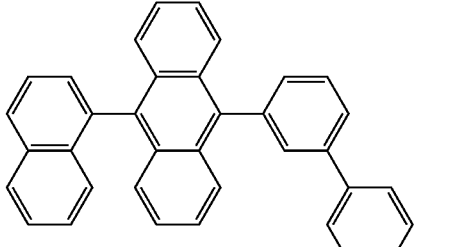

H23
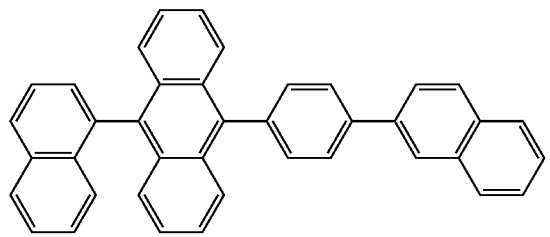
H24
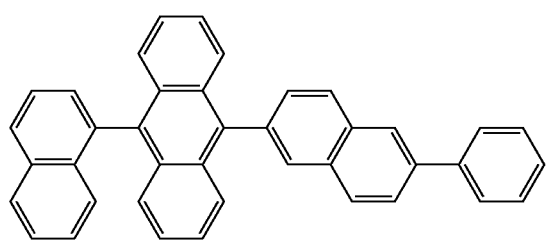
H25
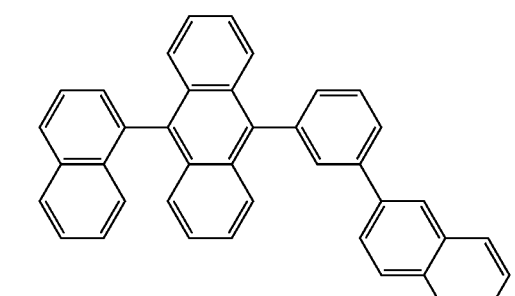
H26
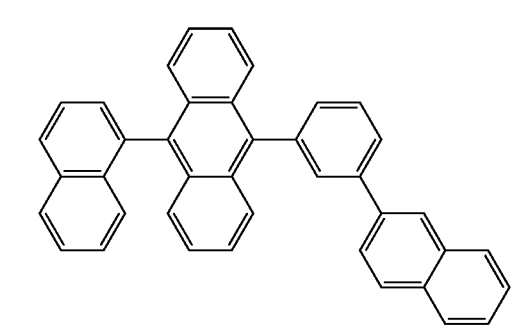
H27
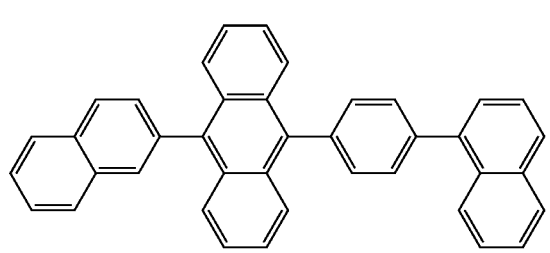
H28
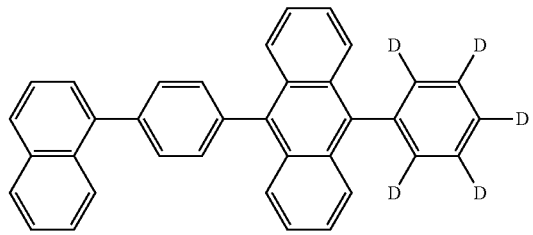
H29
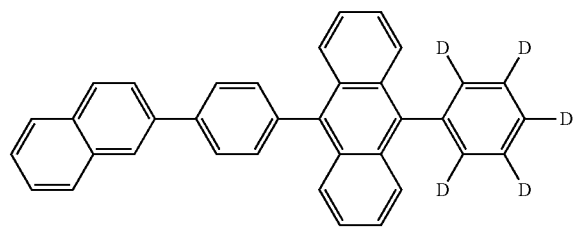
H30
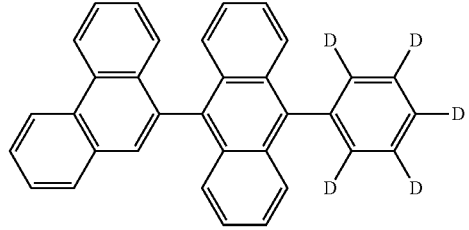
H31
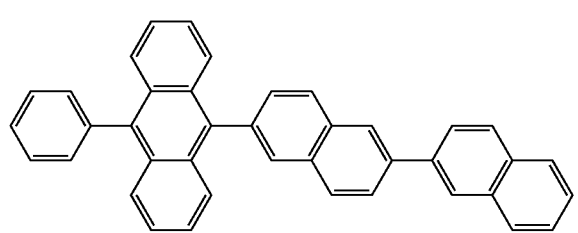
H32
H33
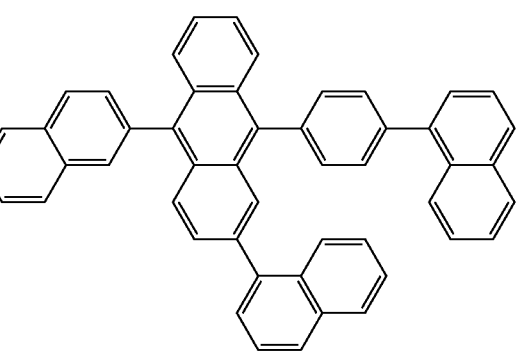

H34
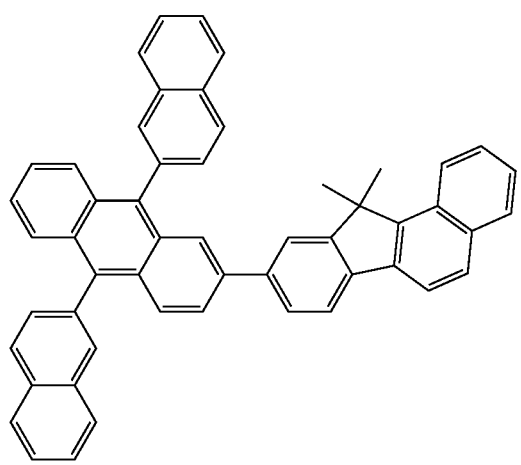
H35
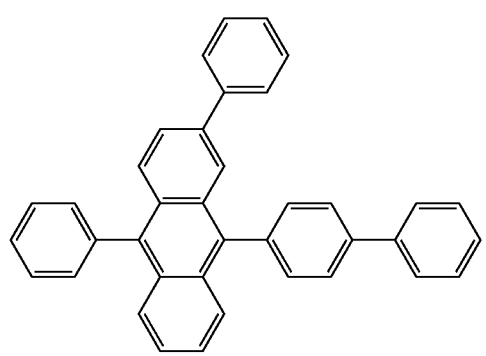
H36
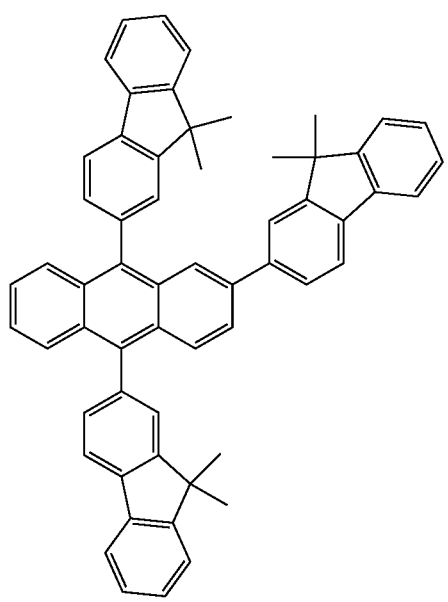
H37
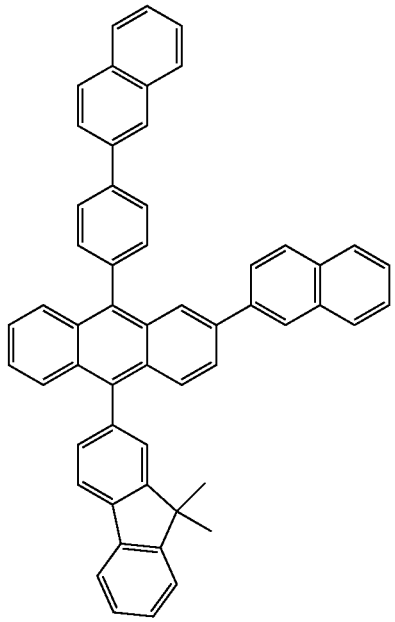
H38
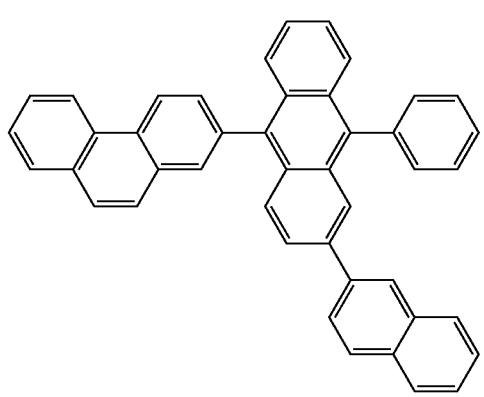
H39
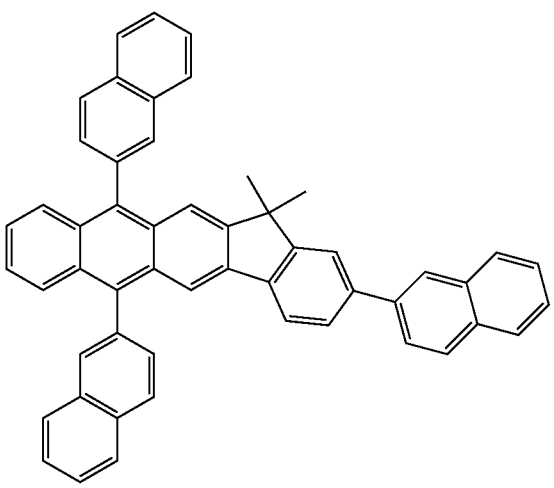

H40
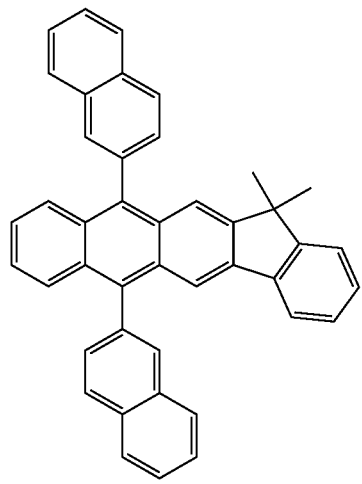
H41
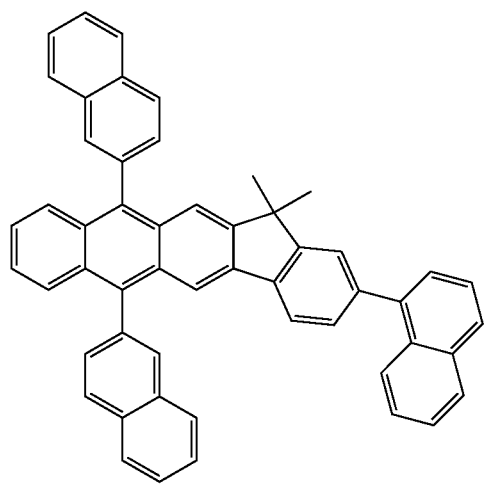
H42
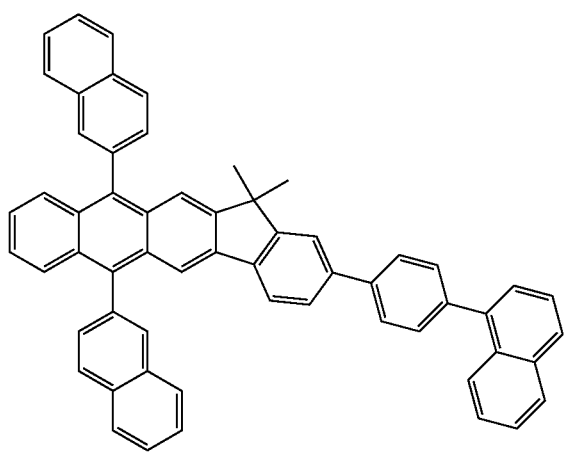
H43
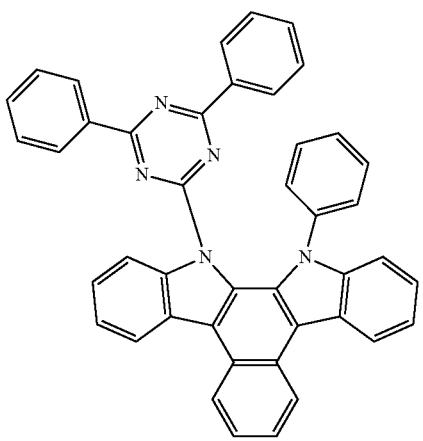
H44
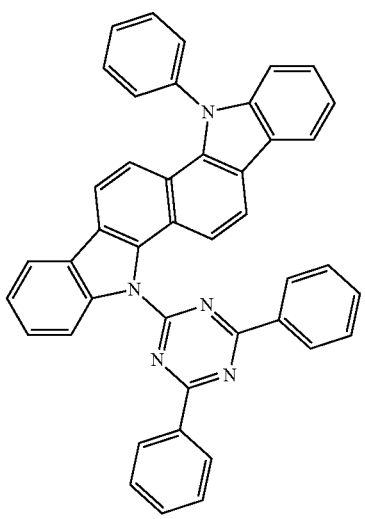
H45
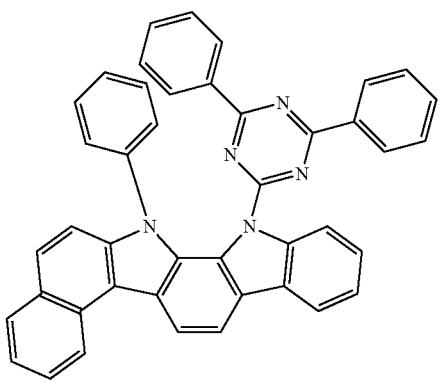
Alternatively, the host may be or include at least one selected from Compounds H43 to H49, but embodiments of the present disclosure are not limited thereto:

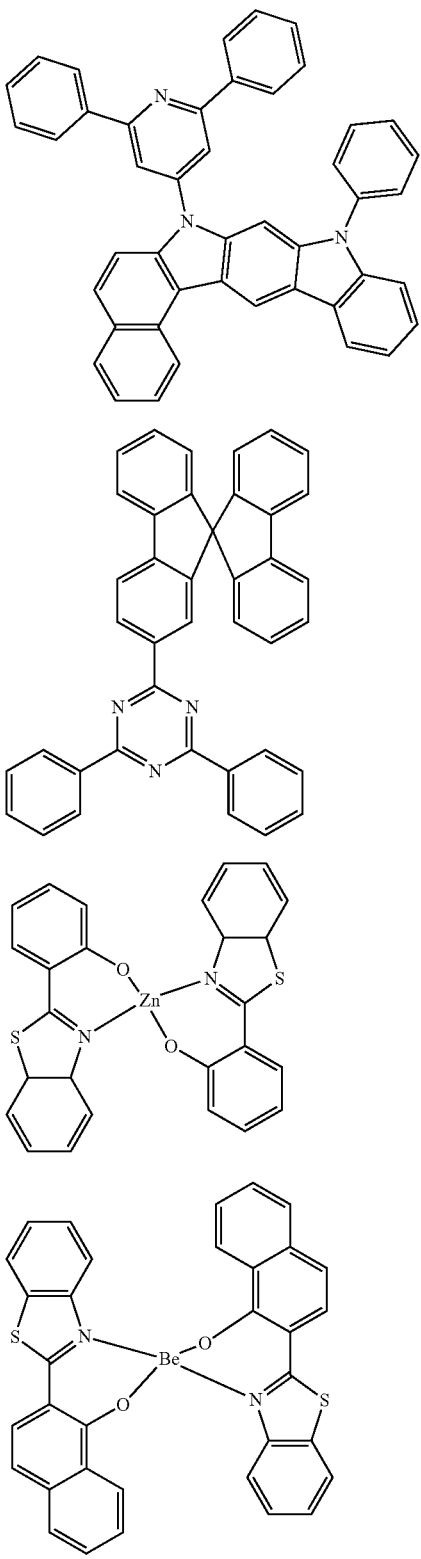

H46

H47

H48

H49

The dopant may include at least one selected from a fluorescent dopant and a phosphorescent dopant.

For example, the phosphorescent dopant may include an organometallic compound including one selected from iridium (Ir), platinum (Pt), osmium (Os), titanium (Ti), zirconium (Zr), hafnium (Hf), europium (Eu), terbium (Tb), thulium (Tm), Rh (rhodium), and Cu.

For another example, the phosphorescent dopant may include an organometallic complex represented by Formula 401:

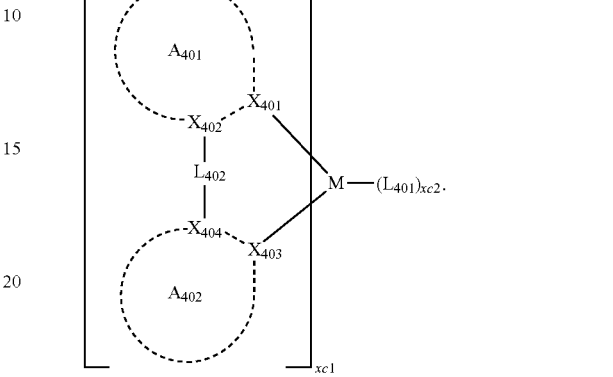

Formula 401

In Formula 401,

M may be selected from iridium (Ir), platinum (Pt), osmium (Os), titanium (Ti), zirconium (Zr), hafnium (Hf), europium (Eu), terbium (Tb), and thulium (Tm), $X_{401}$ to $X_{404}$ may each be independently selected from nitrogen (N) and carbon (C), ring $A_{401}$ and ring $A_{402}$ may each be independently selected from a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isoxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzoimidazole, a substituted or unsubstituted benzofuran, a substituted or unsubstituted benzothiophene, a substituted or unsubstituted isobenzothiophene, a substituted or unsubstituted benzoxazole, a substituted or unsubstituted isobenzoxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene, at least one substituent of the substituted benzene, the substituted naphthalene, the substituted fluorene, the substituted spiro-fluorene, the substituted indene, the substituted pyrrole, the substituted thiophene, the substituted furan, the substituted imidazole, the substituted pyrazole, the substituted thiazole, the substituted isothiazole, the substituted oxazole, the substituted isoxazole, the substituted pyridine, the substituted pyrazine, the substituted pyrimidine, the substituted pyridazine, the substituted quinoline, the substituted isoquinoline, the substituted benzoquinoline, the substituted quinoxaline, the substituted quinazoline, the substituted carbazole, the substituted benzoimidazole, the substituted benzofuran, the substituted benzothiophene, the substituted isobenzothiophene, the substituted benzoxazole, the substituted isobenzoxazole, the substituted triazole, the substituted oxadiazole, the substituted triazine, the substituted dibenzofuran, and the substituted dibenzothiophene may be selected from the group consisting of:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{401}$)($Q_{402}$), —Si($Q_{403}$)($Q_{404}$)($Q_{405}$), and —B($Q_{406}$)($Q_{407}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{411}$)($Q_{412}$), —Si($Q_{413}$)($Q_{414}$)($Q_{415}$), and —B($Q_{416}$)($Q_{417}$);

—N($Q_{421}$)($Q_{422}$), —Si($Q_{423}$)($Q_{424}$)($Q_{425}$), and —B($Q_{426}$)($Q_{427}$), $L_{401}$ may be an organic ligand, xc1 may be selected from 1, 2, and 3, and xc2 may be selected from 0, 1, 2, and 3.

$Q_{401}$ to $Q_{407}$, $Q_{411}$ to $Q_{417}$, and $Q_{421}$ to $Q_{427}$ may each be the same as described herein in connection with $Q_1$.

$L_{401}$ may be selected from a monovalent organic ligand, a divalent organic ligand, or a trivalent organic ligand. For example, $L_{401}$ may be a halogen ligand (e.g., Cl and/or F), a diketone ligand (e.g., acetylacetonate, 1,3-diphenyl-1,3-propane dionate, 2,2,6,6-tetramethyl-3,5-heptanedionate, and/or hexafluoroacetonate), a carboxylic acid ligand (e.g., picolinate, dimethyl-3-pyrazolecarboxylate, and/or benzoate), a carbon monoxide ligand, an isonitrile ligand, a cyano group ligand, or a phosphorus ligand (e.g., phosphine and/or phosphite), but embodiments of the present disclosure are not limited thereto.

When ring $A_{401}$ in Formula 401 includes two or more substituents, the substituents may be linked (e.g., coupled) to each other to form a saturated or unsaturated ring.

When ring $A_{402}$ in Formula 401 includes two or more substituents, the substituents may be linked (e.g., coupled) to each other to form a saturated or unsaturated ring.

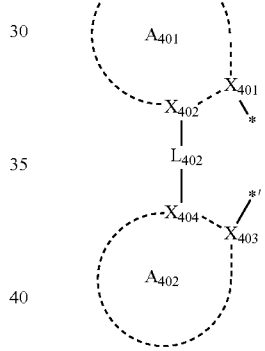

When xc1 in Formula 401 is two or more, a plurality of ligands may be identical to or different from each other. When xc1 in Formula 401 is two or more, ring $A_{401}$ and ring $A_{402}$ may each be directly connected (e.g., by a bond) or connected via a linking group (e.g., a $C_1$-$C_5$ alkylene group, —N(R')— (where R' may be a $C_1$-$C_{10}$ alkyl group or a $C_6$-$C_{20}$ aryl group), and/or —C(=O)—) to $A_{401}$ and $A_{402}$, respectively, of another adjacent ligand.

The phosphorescent dopant may include at least one selected from Compounds PD1 to PD74, but embodiments of the present disclosure are not limited thereto:

PD1

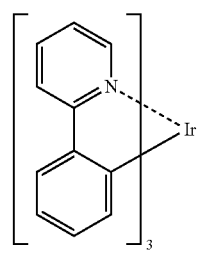

PD2 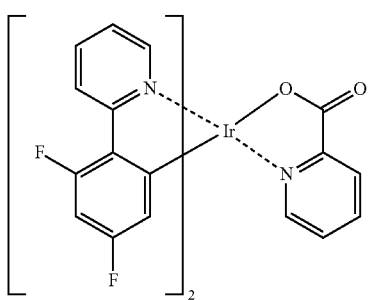
PD7 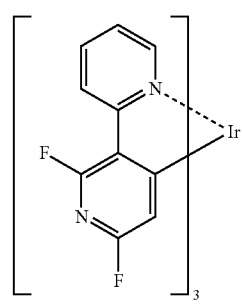
PD3 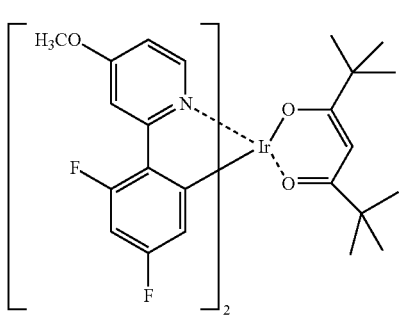
PD8 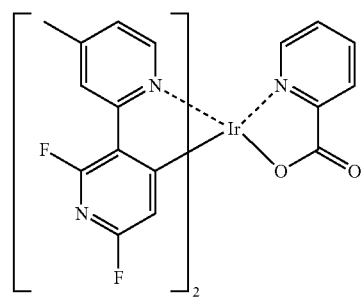
PD4 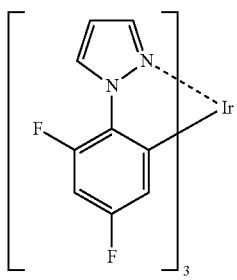
PD9 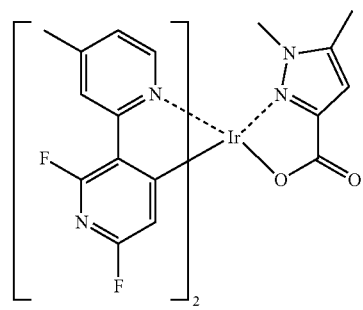
PD5 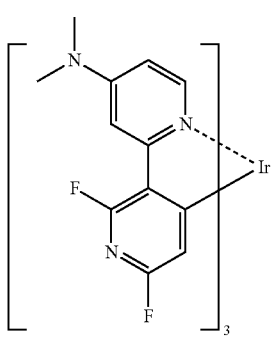
PD10 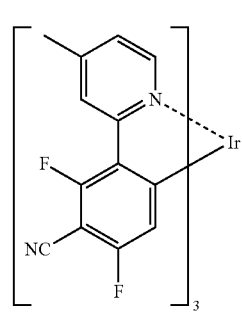
PD6 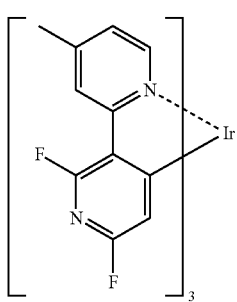
PD11 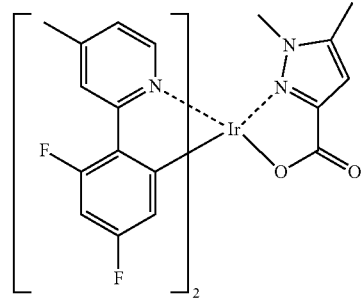

PD12
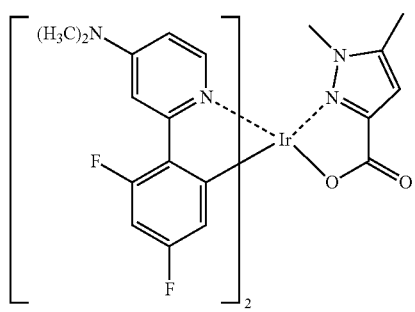
PD17
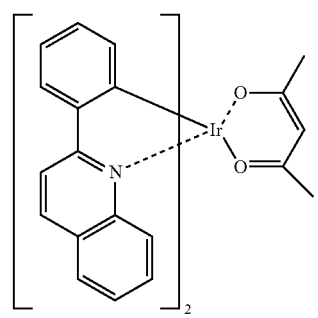
PD13
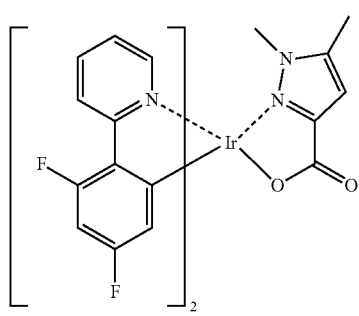
PD18
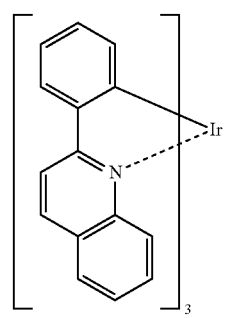
PD14
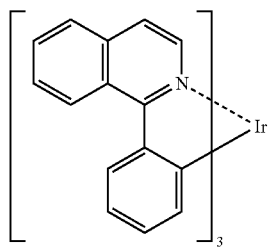
PD19
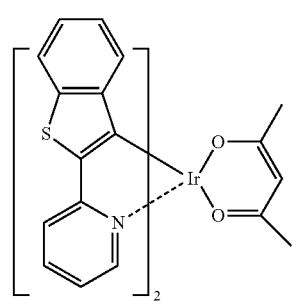
PD15
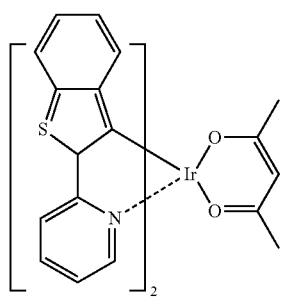
PD20
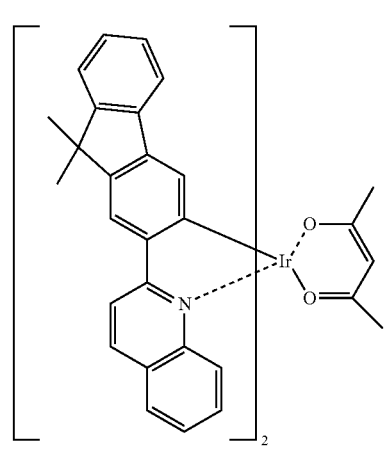
PD16

PD21 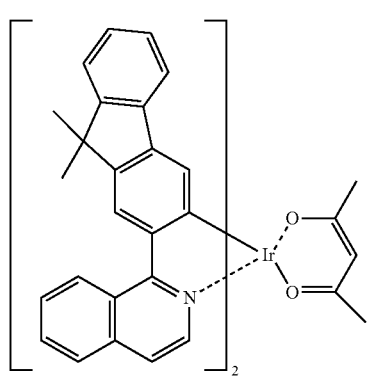
PD22 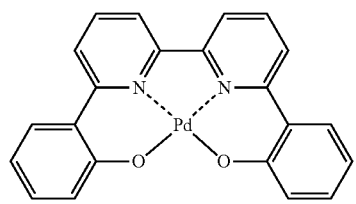
PD23 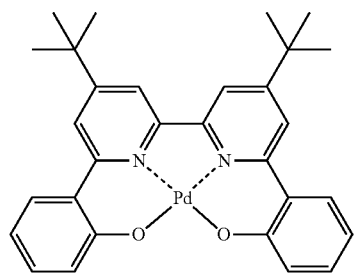
PD24 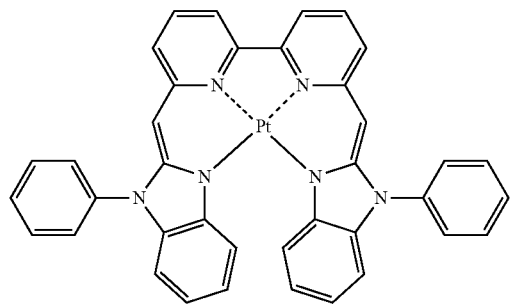
PD25 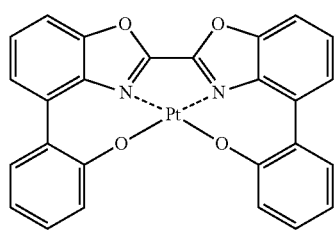
PD26 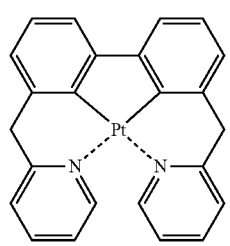
PD27 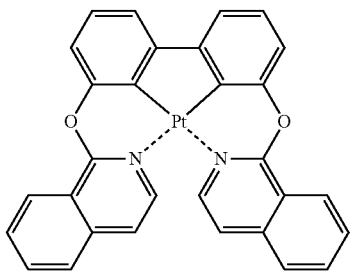
PD28 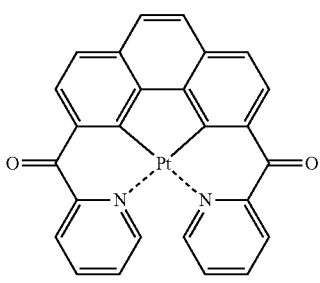
PD29 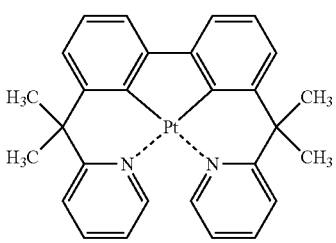
PD30 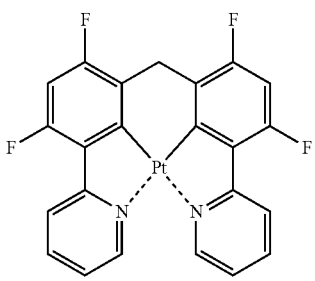
PD31 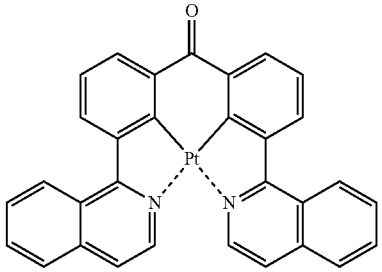
PD32 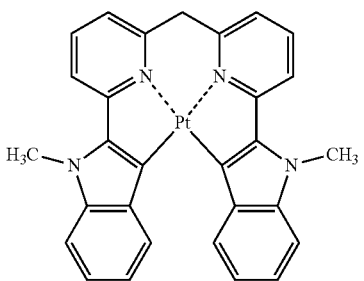

-continued
PD33
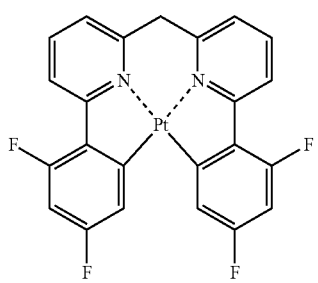
PD34
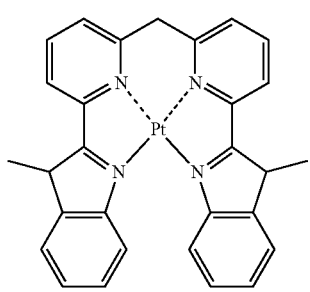
PD35
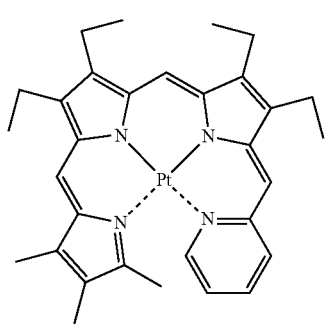
PD36
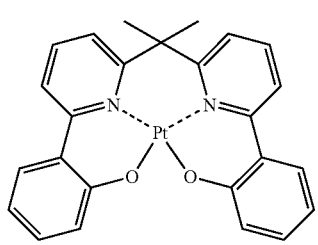
PD37
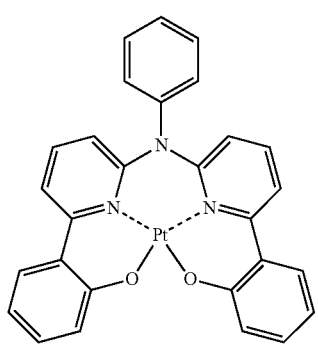
-continued
PD38
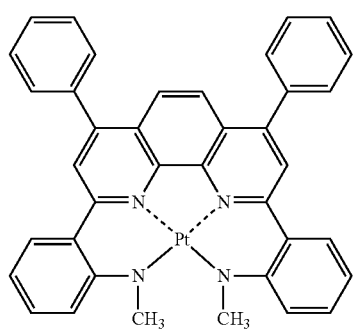
PD39
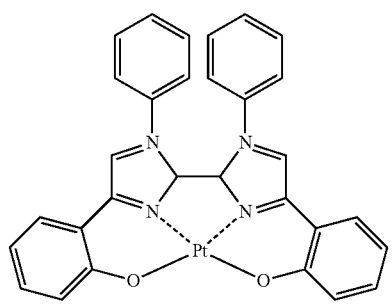
PD40
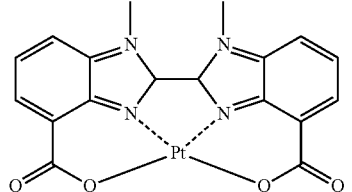
PD41
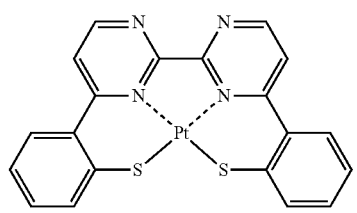
PD42
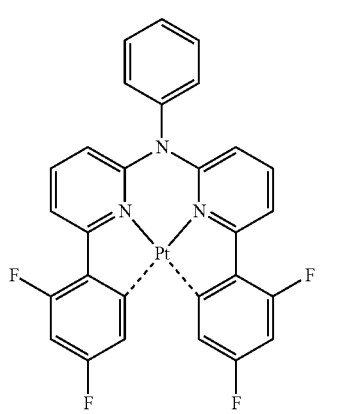

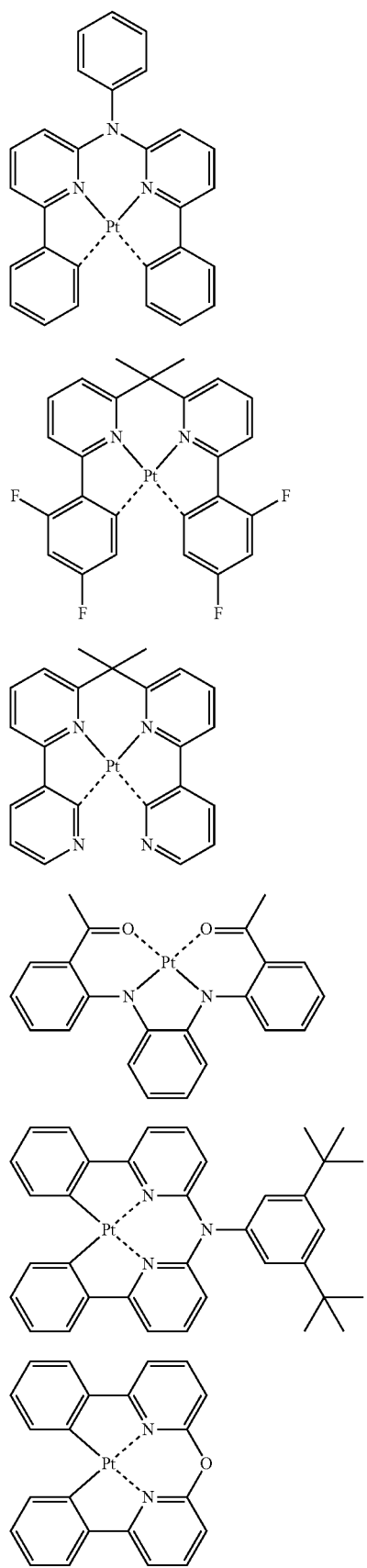
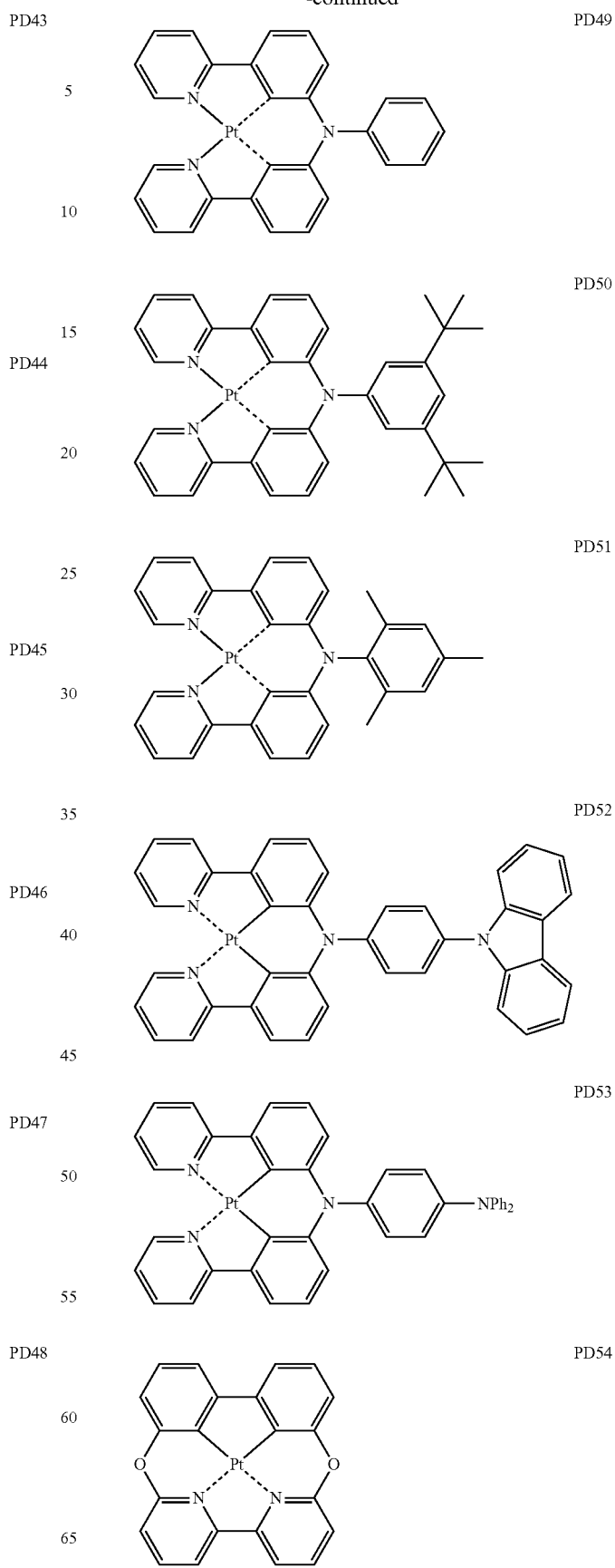

PD55 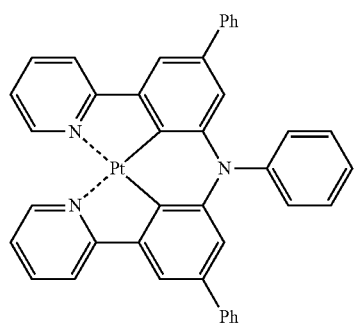
PD56 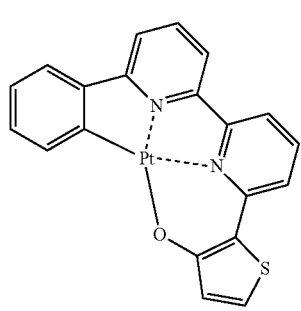
PD57 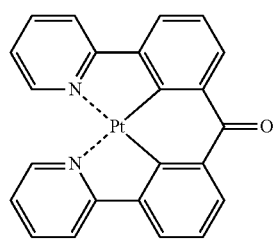
PD58 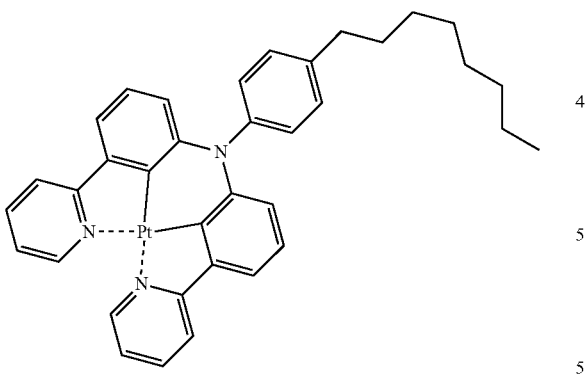
PD59 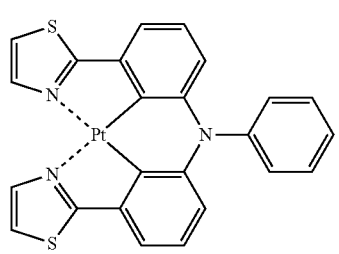
PD60 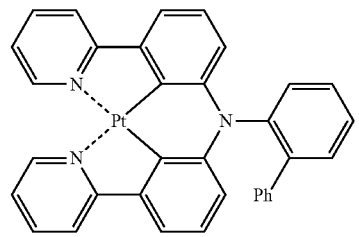
PD61 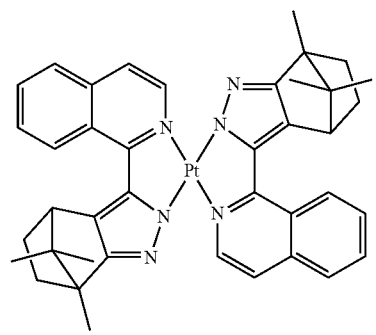
PD62 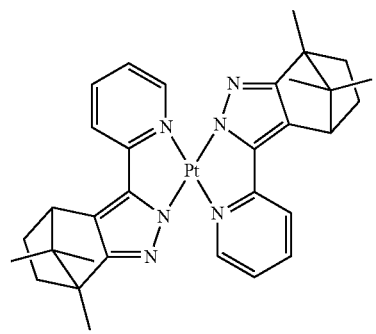
PD63 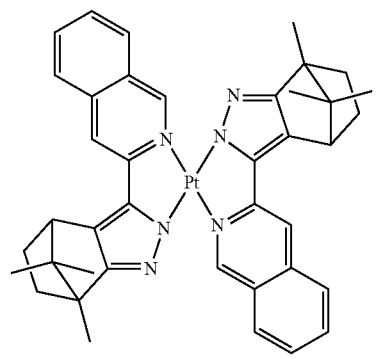
PD64 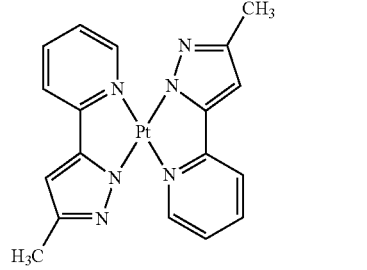

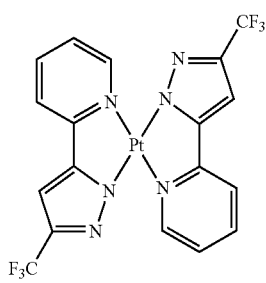
PD65
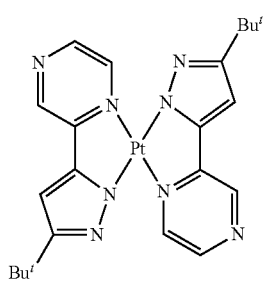
PD66
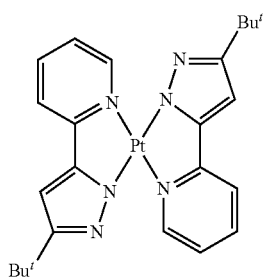
PD67
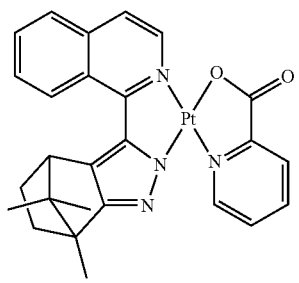
PD68
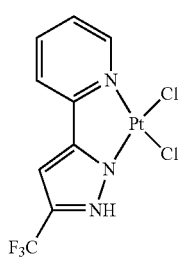
PD69
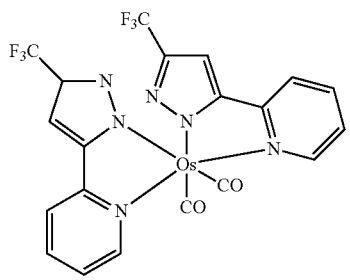
PD70, PD71, PD72, PD73, PD74
In one embodiment, the phosphorescent dopant may include PtOEP:

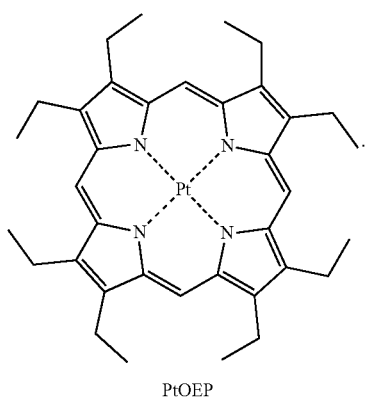
PtOEP
The fluorescent dopant may include at least one selected from DPVBi, DPAVBi, TBPe, DCM, DCJTB, Coumarin 6, and C545T:
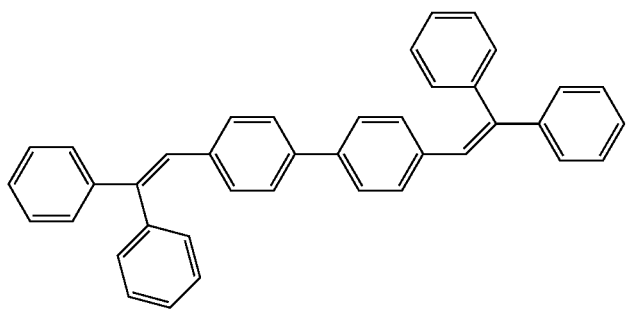
DPVBi
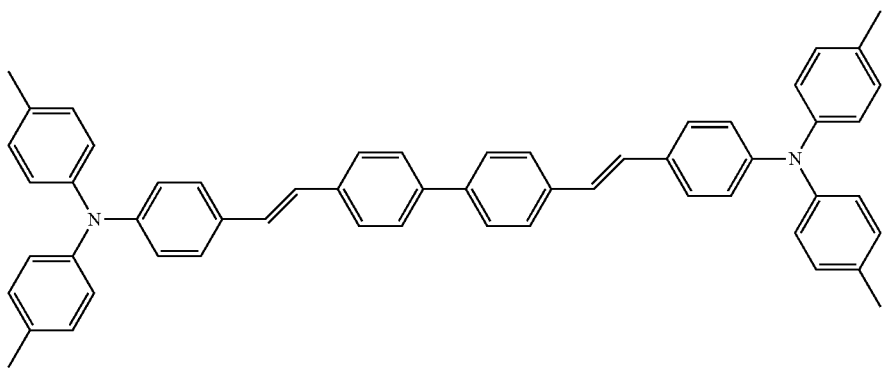
DPAVBi
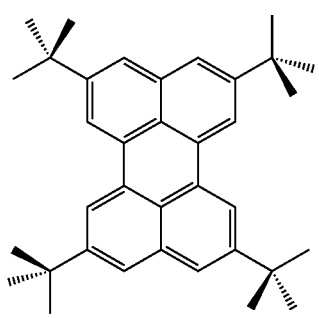
TBPe
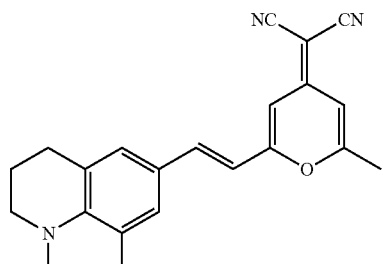
DCM
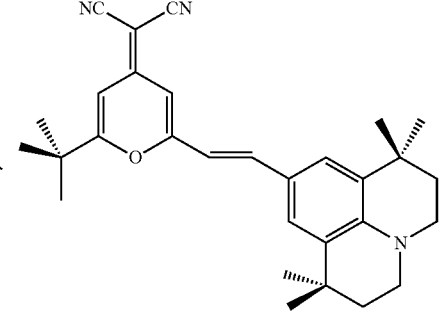
DCJTB

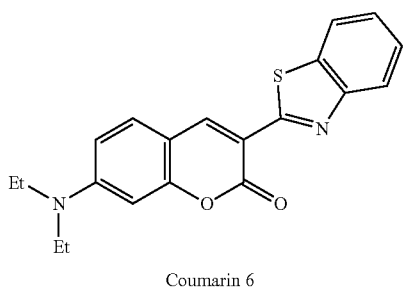
Coumarin 6

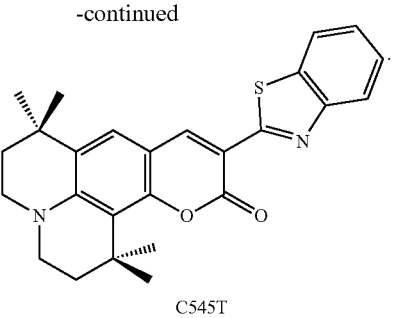
C545T

Alternatively, the fluorescent dopant may include a compound represented by Formula 501:

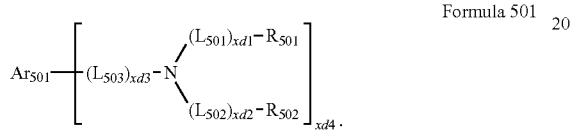

In Formula 501, $Ar_{501}$ may be selected from the group consisting of:

a naphthalene, a heptalene, a fluorenene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{501}$)($Q_{502}$) ($Q_{503}$) (where $Q_{501}$ to $Q_{503}$ may each be independently selected from hydrogen, a $C_1$-$C_{60}$ alkyl group, a $C_2$-$C_{60}$ alkenyl group, a $C_6$-$C_{60}$ aryl group, and a $C_2$-$C_{60}$ heteroaryl group), $L_{501}$ to $L_{503}$ may each be the same as described herein in connection with $L_{201}$, $R_{501}$ and $R_{502}$ may each be independently selected from the group consisting of:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, a dibenzothiophenyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, xd1 to xd3 may each be independently selected from 0, 1, 2, and 3, and xd4 may be selected from 1, 2, 3, and 4.

The fluorescent dopant may be represented by at least one selected from Compounds FD1 to FD9:

FD1
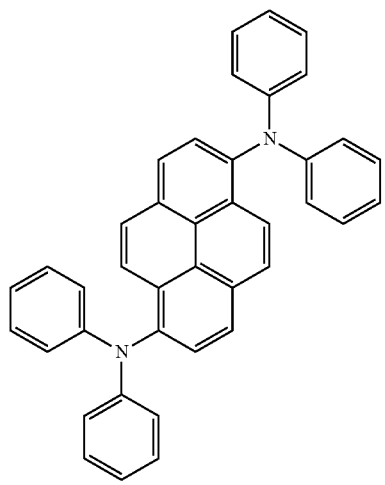
FD2
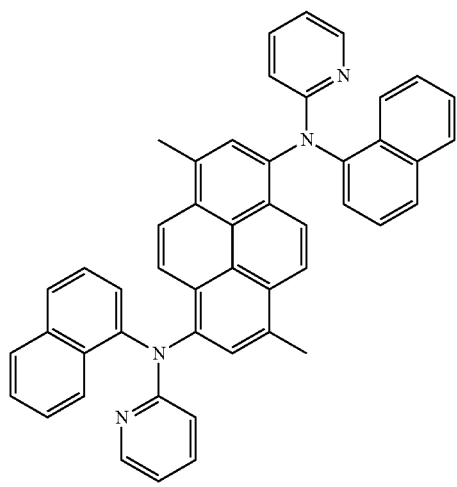
FD3
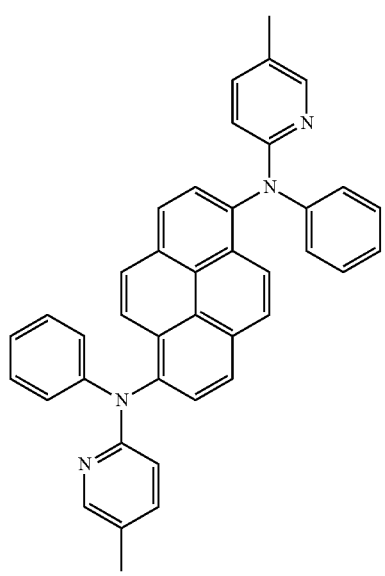
FD4
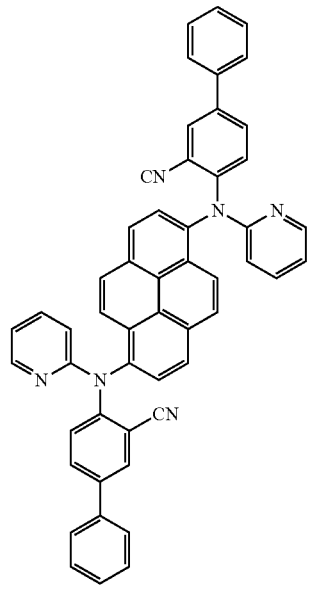
FD5
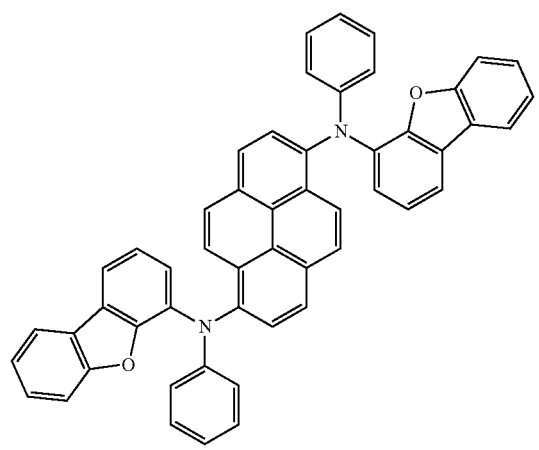
FD6
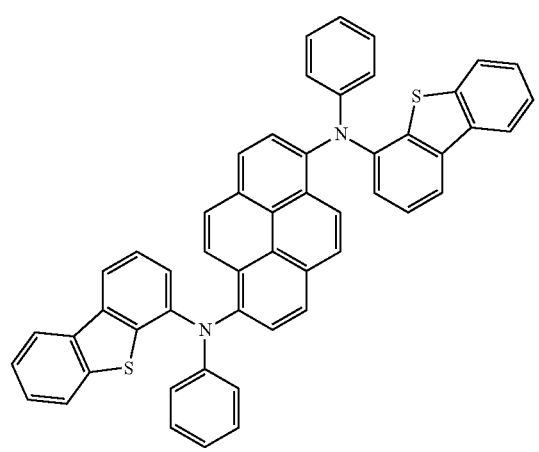

FD7

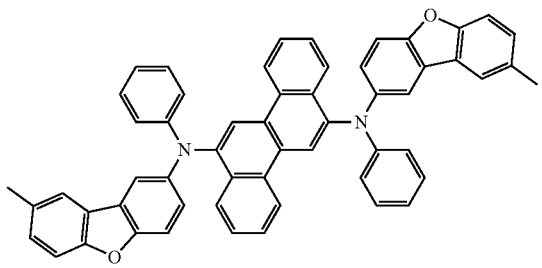

FD8

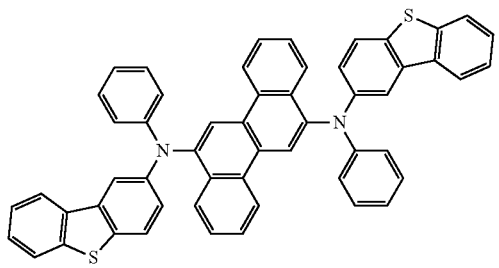

FD9

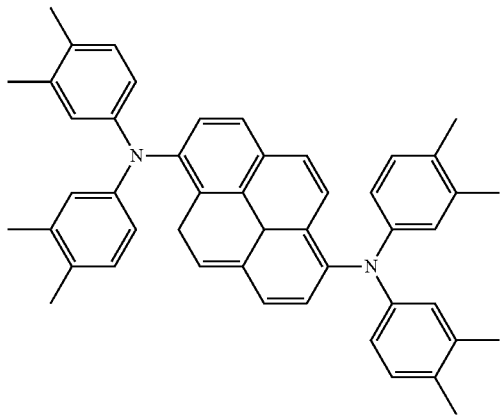

The amount of the dopant included in the first and second emission layers may be about 0.01 to about 15 parts by weight based on about 100 parts by weight of the host, but embodiments of the present disclosure are not limited thereto.

The thickness of the first and second emission layers may be about 100 Å to about 1,000 Å, and in some embodiments, about 200 Å to about 600 Å. When the thickness of the first and second emission layers is within these ranges, excellent light-emission characteristics may be obtained without a substantial increase in driving voltage.

The first and second electron transport regions may be on the first and second emission layers, respectively.

The first and second electron transport regions may each include at least one selected from an HBL, an ETL, and an EIL, but embodiments of the layers are not limited thereto.

For example, the first and second electron transport regions may each have a structure of ETL/EIL or a structure of HBL/ETL/EIL, wherein layers are sequentially stacked in each stated order on the first and second emission layers.

In one or more embodiments, in the organic light-emitting device 10, the first emission unit may further include a first electron transport region between the first emission layer and the first charge generation layer, and the second emission sion unit may further include a second electron transport region between the second emission layer and the second electrode.

When the first and second electron transport regions each include an HBL, the HBL may be formed on the first and second emission layers using one or more suitable methods selected from vacuum deposition, spin coating, casting, an LB method, ink-jet printing, laser-printing, and LITI. When the HBL is formed by vacuum deposition and/or spin coating, the deposition conditions and coating conditions may be similar to the conditions used for forming the HIL.

The HBL may include, for example, at least one selected from BCP and Bphen, but embodiments of the present disclosure are not limited thereto.

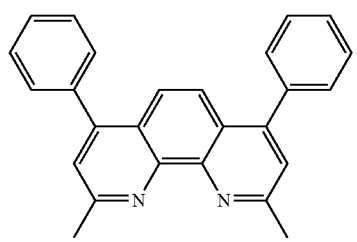

BCP

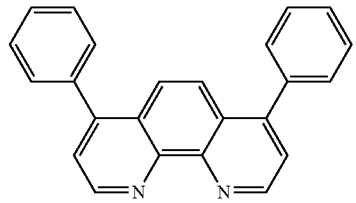

Bphen

The thickness of the HBL may be about 20 Å to about 1,000 Å, and in some embodiments, about 30 Å to about 300 Å. When the thickness of the HBL is within these ranges, excellent hole blocking characteristics may be obtained without a substantial increase in driving voltage.

The first and second electron transport regions may each include an ETL. The ETL may be formed on the first and second emission layers using one or more suitable methods selected from vacuum deposition, spin coating, casting, an LB method, ink-jet printing, laser-printing, and LITI. When the ETL is formed by vacuum deposition and/or spin coating, the deposition conditions and coating conditions may be similar to the conditions used for forming the HIL.

The ETL may include at least one selected from a compound represented by Formula 601 and a compound represented by Formula 602:

$$Ar_{601}-[(L_{601})_{xe1}-E_{601}]_{xe2}.$$  Formula 301

In Formula 601, $Ar_{601}$ may be selected from the group consisting of:
a naphthalene, a heptalene, a fluorenene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, an indenoanthracene; and
a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{301}$)($Q_{302}$)($Q_{303}$) (where $Q_{301}$ to $Q_{303}$ may each be independently selected from hydrogen, a $C_1$-$C_{60}$ alkyl group, a $C_2$-$C_{60}$ alkenyl group, a $C_6$-$C_{60}$ aryl group, or a $C_2$-$C_{60}$ heteroaryl group), $L_{601}$ may be the same as described herein in connection with $L_{201}$, $E_{601}$ may be selected from the group consisting of:

a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinol group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, xe1 may be selected from 0, 1, 2, and 3, and
xe2 may be selected from 1, 2, 3, and 4.

Formula 602

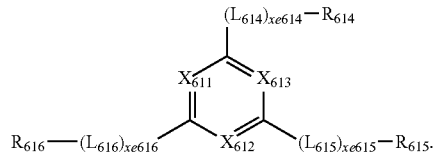

In Formula 602, $X_{611}$ may be selected from N and C-($L_{611}$)$_{xe611}$-$R_{611}$, $X_{612}$ may be selected from N and C-($L_{612}$)$_{xe612}$-$R_{612}$, and $X_{613}$ may be selected from N and C-($L_{613}$)$_{xe613}$-$R_{613}$, wherein at least one selected from $X_{611}$ to $X_{613}$ may be N, $L_{611}$ to $L_{616}$ may each be the same as described herein in connection with $L_{201}$, $R_{611}$ to $R_{616}$ may each be independently selected from the group consisting of:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and xe611 to xe616 may each be independently selected from 0, 1, 2, and 3.

The compound represented by Formula 601 and the compound represented by Formula 602 may each be independently selected from Compounds ET1 to ET15:

ET1

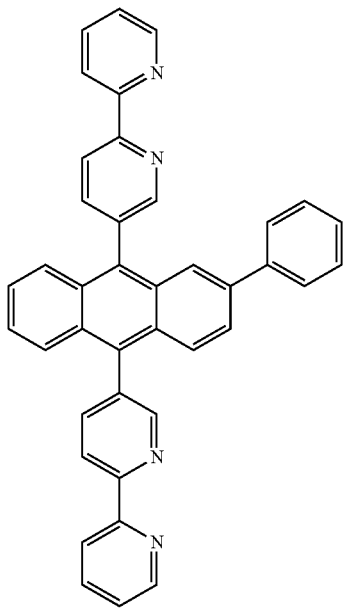

ET2

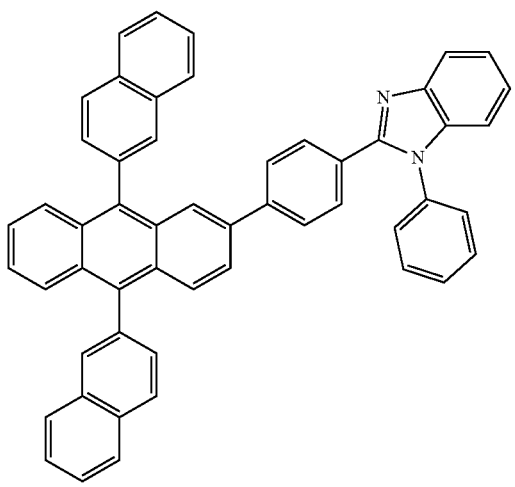

ET3

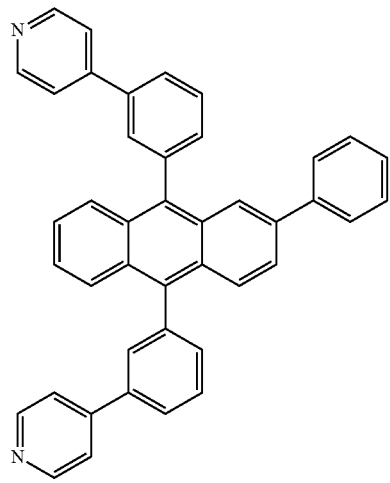

ET4

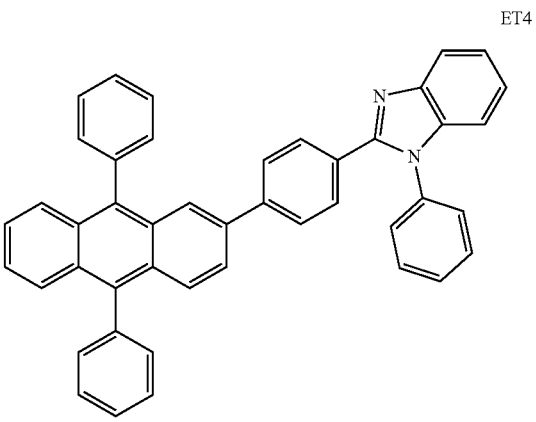

ET5

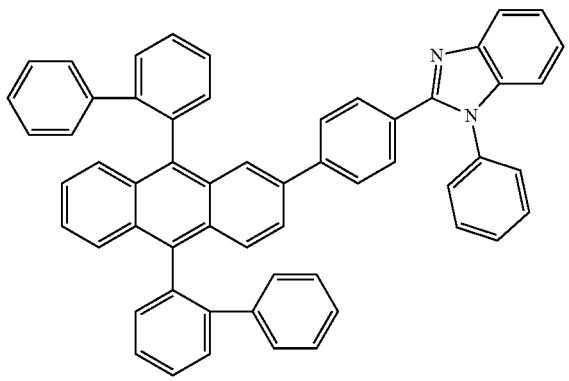

ET6
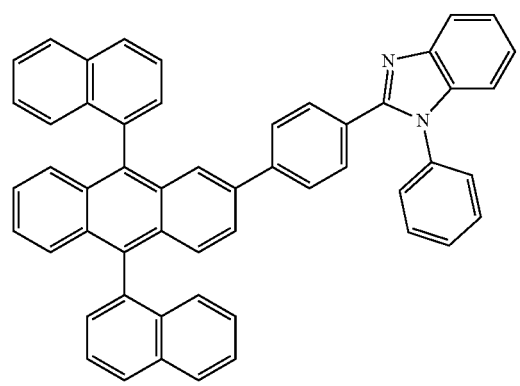
ET7
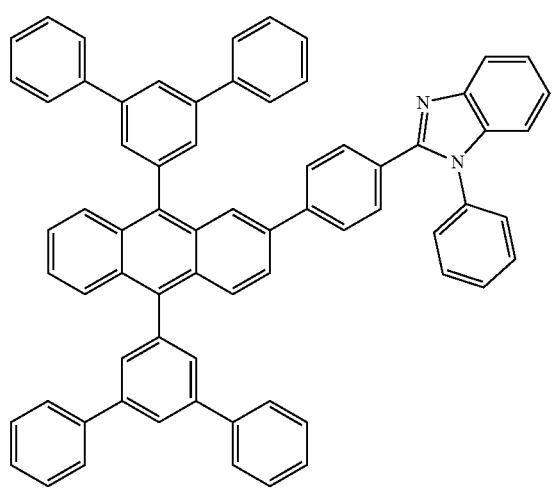
ET8
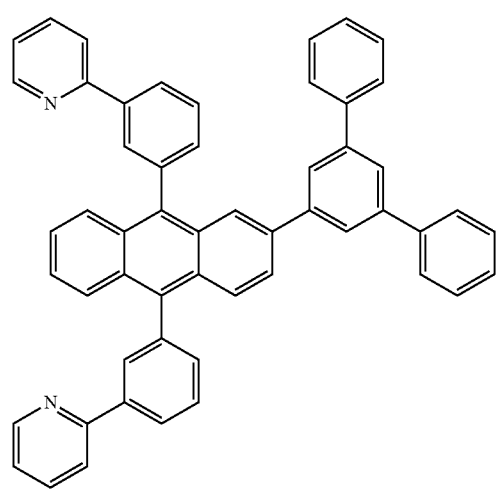
ET9
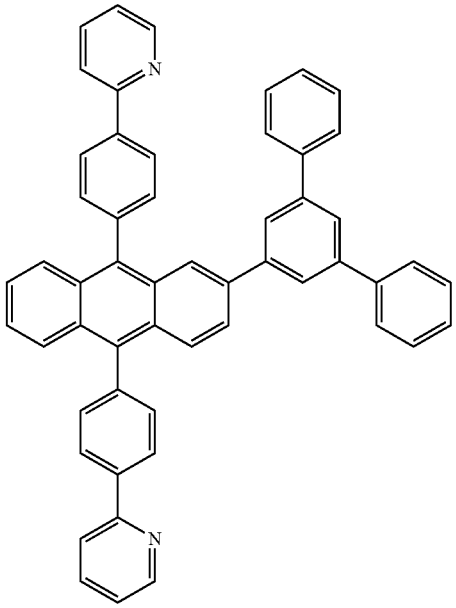
ET10
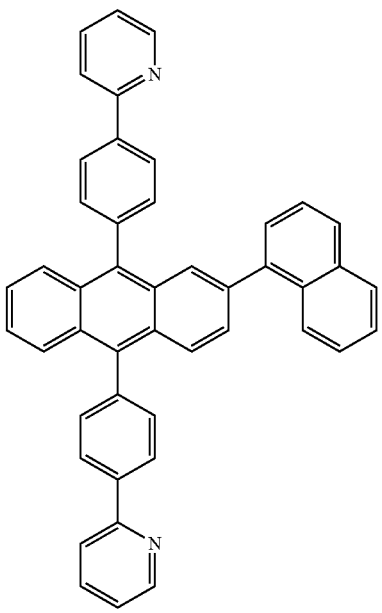

ET11
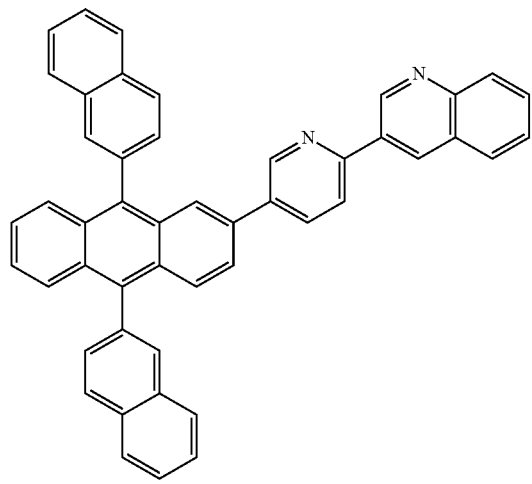
ET12
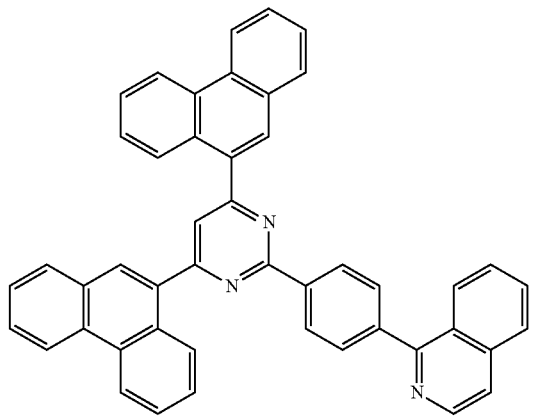
ET13
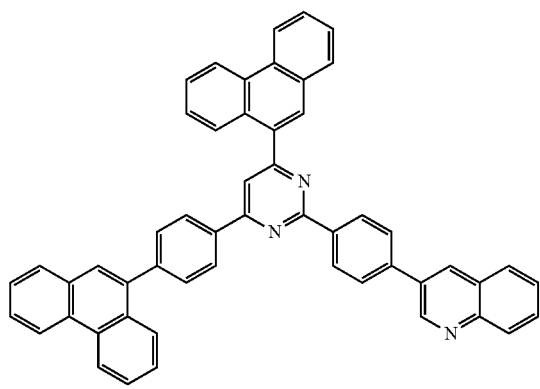
ET14
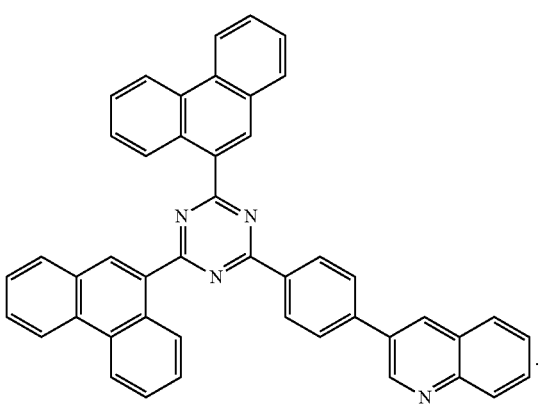
ET15
Alternatively, the ETL may include at least one selected from BCP, Bphen, Alq$_3$, Balq, TAZ, and NTAZ below:
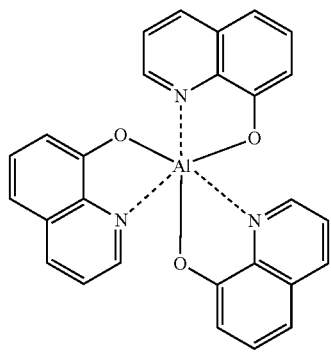
Alq$_3$

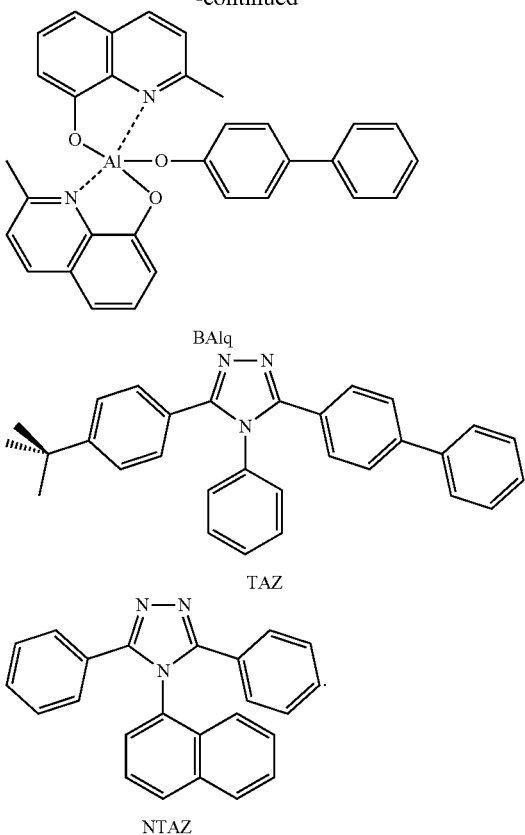

The thickness of the ETL may be about 100 Å to about 1,000 Å, and in some embodiments, about 150 Å to about 500 Å. When the thickness of the ETL is within these ranges, satisfactory electron transporting characteristics may be obtained without a substantial increase in driving voltage.

The ETL may further include, in addition to these materials, a metal-containing material.

The metal-containing material may include a Li complex. The Li complex may include, for example, Compound ET-D1 (lithium quinolate (LiQ)) and/or ET-D2:

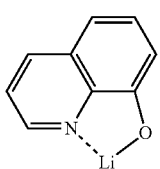
ET-D1

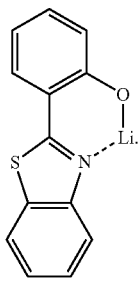
ET-D2

The first and second electron transport regions may each include an electron injection layer (EIL) to facilitate electron injection from the second electrode 190.

The EIL may be formed on the ETL using one or more suitable methods selected from vacuum deposition, spin coating, casting, an LB method, ink-jet printing, laser-printing, and LITI. When the EIL is formed by vacuum deposition and/or spin coating, the deposition conditions and coating conditions may be similar to the conditions used for forming the HIL.

The EIL may include at least one selected from LiF, NaCl, CsF, $Li_2O$, BaO, and LiQ.

The thickness of the EIL may be about 1 Å to about 100 Å, and in some embodiments, about 3 Å to about 90 Å. When the thickness of the EIL is within these ranges, satisfactory electron injecting characteristics may be obtained without a substantial increase in driving voltage.

The second electrode 190 may be a cathode, which is an electron injection electrode. The material for forming the second electrode 190 may be selected from a metal, an alloy, an electrically conductive compound, and combinations thereof, each having a relatively low work function. Non-limiting examples of the material for forming the second electrode 190 may include Li, Mg, Al, Al—Li, Ca, Mg—In, and Mg—Ag. In some embodiments, the second electrode 190 may be a semi-transmissive electrode or a transmissive electrode, and the material for forming the second electrode 190 may include ITO or IZO.

Hereinbefore, the organic light-emitting device 10 has been described with reference to the drawing, but embodiments of the present disclosure are not limited thereto.

The term "$C_1$-$C_{60}$ alkyl group" as used herein refers to a linear or branched aliphatic hydrocarbon monovalent group having 1 to 60 carbon atoms, and non-limiting examples thereof may include a methyl group, an ethyl group, a propyl group, an isobutyl group, a sec-butyl group, a ter-butyl group, a pentyl group, an iso-amyl group, and a hexyl group. The term "$C_1$-$C_5$ alkylene group" as used herein refers to a divalent group having substantially the same structure as the $C_1$-$C_5$ alkyl group.

The term "$C_1$-$C_{60}$ alkoxy group" as used herein refers to a monovalent group represented by —O-$A_{101}$ (where $A_{101}$ is a $C_1$-$C_{60}$ alkyl group), and non-limiting examples thereof may include a methoxy group, an ethoxy group, and an isopropyloxy group.

The term "$C_2$-$C_{60}$ alkenyl group" as used herein refers to a hydrocarbon group formed by substituting at least one carbon-carbon double bond in the body (e.g., middle) or at the terminus of the $C_2$-$C_{60}$ alkyl group, and non-limiting examples thereof may include an ethenyl group, a propenyl group, and a butenyl group.

The term "$C_2$-$C_{60}$ alkynyl group" as used herein refers to a hydrocarbon group having at least one carbon-carbon triple bond in the body (e.g., middle) or at the terminus of the $C_2$-$C_{60}$ alkyl group, and non-limiting examples thereof may include an ethynyl group and a propynyl group.

The term "$C_3$-$C_{10}$ cycloalkyl group" as used herein refers to a monovalent saturated hydrocarbon monocyclic group having 3 to 10 carbon atoms, and non-limiting examples thereof may include a cyclopropyl group, a cyclobutyl group, a cyclopentyl group, a cyclohexyl group, and a cycloheptyl group.

The term "$C_1$-$C_{10}$ heterocycloalkyl group" as used herein refers to a monovalent monocyclic group having at least one heteroatom selected from N, O, Si, P, and S as a ring-forming atom in addition to 1 to 10 carbon atoms, and non-limiting examples thereof may include a tetrahydrofuranyl group and a tetrahydrothiophenyl group.

The term "$C_3$-$C_{10}$ cycloalkenyl group" as used herein refers to a monovalent monocyclic group that has 3 to 10 carbon atoms and at least one double bond in the ring thereof, and does not have aromaticity. Non-limiting examples thereof may include a cyclopentenyl group, a cyclohexenyl group, and a cycloheptenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms, and at least one double bond in its ring. Non-limiting examples of the $C_1$-$C_{10}$ heterocycloalkenyl group may include a 2,3-hydrofuranyl group and a 2,3-hydrothiophenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group may include a phenyl group, a naphthyl group, an anthracenyl group, a phenanthrenyl group, a pyrenyl group, and a chrysenyl group.

The term "$C_1$-$C_{60}$ heteroaryl group" as used herein refers to a monovalent carbocyclic aromatic system having at least one heteroatom selected from N, O, Si, P, and S as a ring-forming atom in addition to 1 to 60 carbon atoms. Non-limiting examples of the $C_1$-$C_{60}$ heteroaryl group may include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group includes two or more rings, the rings may be fused (e.g., coupled) to each other.

The term "$C_6$-$C_{60}$ aryloxy group" as used herein refers to a group represented by —O-$A_{102}$ (where $A_{102}$ is a $C_6$-$C_{60}$ aryl group), and the term "$C_6$-$C_{60}$ arylthio group" as used herein refers to a group represented by —S-$A_{103}$ (where $A_{103}$ is a $C_6$-$C_{60}$ aryl group).

The term "monovalent non-aromatic condensed polycyclic group" as used herein refers to a monovalent group that has two or more rings condensed (e.g., coupled) to each other, only carbon atoms as a ring forming atom, and non-aromaticity in the entire molecular structure. A non-limiting example of the monovalent non-aromatic condensed polycyclic group may be a fluorenyl group.

The term "monovalent non-aromatic condensed heteropolycyclic group" as used herein refers to a monovalent group that has two or more rings condensed to each other, has a heteroatom selected from N, O, Si, P, and S in addition to carbon atoms as ring forming atoms, and has non-aromaticity in the entire molecular structure. A non-limiting example of the monovalent non-aromatic condensed heteropolycyclic group may be a carbazolyl group.

An organic light-emitting device according to embodiments of the present disclosure may have high efficiency and long lifespan.

It should be understood that embodiments described herein should be considered in a descriptive sense only and not for purposes of limitation. Descriptions of features or aspects within each embodiment should typically be considered as available for other similar features or aspects in other embodiments.

The use of "may" when describing embodiments of the present disclosure refers to "one or more embodiments of the present disclosure". In addition, as used herein, the terms "use", "using", and "used" may be considered synonymous with the terms "utilize", "utilizing", and "utilized", respectively.

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more embodiments have been described with reference to the drawings, it will be understood by those of ordinary skill in the art that various changes in form and details may be made therein without departing from the spirit and scope of the present disclosure, as defined by the following claims and equivalents thereof.

What is claimed is:

1. An organic light-emitting device comprising:
a first electrode;
a second electrode facing the first electrode;
a first emission unit and a second emission unit, a first emission unit and a second emission units being between the first electrode and the second electrode; a first charge generation layer between the first emission unit and the second emission unit;
wherein the first emission unit comprises a first emission layer, a first hole transport layer and a first inorganic buffer layer, and the first hole transport layer is between the first emission layer and the first electrode, and
the second emission unit comprises a second emission layer, a second hole transport layer and a second inorganic buffer layer, and the second hole transport layer is between the second emission layer and the first charge generation layer, and wherein,
i) the first inorganic buffer layer is between the first emission layer and the first hole transport layer, or
ii) the second inorganic buffer layer is between the second emission layer and the second hole transport layer.

2. The organic light-emitting device of claim 1, wherein:
the first emission unit further comprises a first hole injection layer between the first hole transport layer and the first electrode, and
the second emission unit further comprises a second hole injection layer between the second hole transport layer and the first charge generation layer.

3. The organic light-emitting device of claim 1, wherein:
the first inorganic buffer layer is directly in contact with the first emission layer, and
the second inorganic buffer layer is directly in contact with the second emission layer.

4. The organic light-emitting device of claim 1, wherein the first inorganic buffer layer and the second inorganic buffer layer each comprises a metal halide.

5. The organic light-emitting device of claim 1, wherein the first inorganic buffer layer and the second inorganic buffer layer each comprises at least one halide compound selected from among an alkali metal halide, an alkaline earth metal halide, a transition metal halide, a post-transition metal halide, and a lanthanum-based metal halide.

6. The organic light-emitting device of claim 1, wherein the first inorganic buffer layer and the second inorganic buffer layer each comprises at least one iodide compound selected from the group consisting of an alkali metal iodide, an alkaline earth metal iodide, a transition metal iodide, a post-transition metal iodide, and a lanthanum-based metal iodide.

7. The organic light-emitting device of claim 1, wherein the first inorganic buffer layer and the second inorganic buffer layer each comprises at least one iodide compound selected from the group consisting of a lithium (Li) iodide, a sodium (Na) iodide, a potassium (K) iodide, a rubidium (Rb) iodide, a cesium (Cs) iodide, a beryllium (Be) iodide, a magnesium (Mg) iodide, a calcium (Ca) iodide, a strontium (Sr) iodide, a barium (Ba) iodide, a ytterbium (Yb) iodide, a samarium (Sm) iodide, a copper (Cu) iodide, a thallium (Tl) iodide, a silver (Ag) iodide, a cadmium (Cd) iodide, a mercury (Hg) iodide, a tin (Sn) iodide, a lead (Pb) iodide, a bismuth (Bi) iodide, a zinc (Zn) iodide, a manganese (Mn) iodide, an iron (Fe) iodide, a cobalt (Co) iodide, a nickel (Ni) iodide, an aluminum (Al) iodide, an indium (In) iodide, a gallium (Ga) iodide, a thorium (Th) iodide, and a uranium (U) iodide.

8. The organic light-emitting device of claim 1, wherein the first inorganic buffer layer and the second inorganic buffer layer each comprises at least one iodide compound selected from the group consisting of LiI, NaI, KI, RbI, CsI, BeI$_2$, MgI$_2$, CaI$_2$, SrI$_2$, BaI$_2$, YbI, YbI$_2$, YbI$_3$, SmI$_3$, CuI, TlI, AgI, CdI$_2$, HgI$_2$, SnI$_2$, PbI$_2$, BiI$_3$, ZnI$_2$, MnI$_2$, FeI$_2$, COI$_2$, NiI$_2$, AlI$_3$, InI$_3$, GaI$_3$, ThI$_4$, and UI$_3$.

9. The organic light-emitting device of claim 1, wherein the first inorganic buffer layer and the second inorganic buffer layer each comprises a metal halide.

10. The organic light-emitting device of claim 4, wherein the first inorganic buffer layer and the second inorganic buffer layer each further comprises at least one metal.

11. The organic light-emitting device of claim 4, wherein the first inorganic buffer layer and the second inorganic buffer layer each further comprises at least one metal selected from among an alkali metal, an alkaline earth metal, a transition metal, a post-transition metal, and a lanthanum-based metal.

12. The organic light-emitting device of claim 4, wherein the first inorganic buffer layer and the second inorganic buffer layer each further comprises at least one metal selected from the group consisting of Li, Na, K, Rb, Cs, Be, Mg, Ca, Sr, Ba, Yb, Sm, Cu, Tl, Ag, Cd, Hg, Sn, Pb, Bi, Zn, Mn, Fe, Co, Ni, Al, In, Ga, Th, and U.

13. The organic light-emitting device of claim 1, wherein the first inorganic buffer layer and the second inorganic buffer layer each comprises a metal halide and a metal.

14. The organic light-emitting device of claim 1, wherein the first inorganic buffer layer and the second inorganic buffer layer each comprises a halide compound of a first metal in addition to a second metal, and wherein the first metal is identical to the second metal.

15. The organic light-emitting device of claim 1, wherein the first inorganic buffer layer and the second inorganic buffer layer each comprises a halide compound of a first metal in addition to a second metal, and wherein the first metal is different from the second metal.

16. The organic light-emitting device of claim 1, wherein the first inorganic buffer layer and the second inorganic buffer layer each has a thickness of about 1 nm to about 20 nm.

17. The organic light-emitting device of claim 1, wherein the first charge generation layer comprises an n-charge generation layer and a p-charge generation layer,
wherein the n-charge generation layer comprises an n-type dopant and the p-charge generation layer comprises a p-type dopant.

18. The organic light-emitting device of claim 1, further comprising:
a third emission unit between the first electrode and the second electrode, and
a second charge generation layer between the second emission unit and the third emission unit,
wherein the third emission unit comprises a third emission layer and a third inorganic buffer layer, and the third inorganic buffer layer comprises at least one iodide compound selected from the group consisting of an alkali metal iodide, an alkaline earth metal iodide, a transition metal iodide, a post-transition metal iodide, and a lanthanum-based metal iodide.

19. The organic light-emitting device of claim 1, wherein the first emission unit further comprises a first electron transport region between the first emission layer and the first charge generation layer, and the second emission unit further comprises a second electron transport region between the second emission layer and the second electrode.

* * * * *

UNITED STATES PATENT AND TRADEMARK OFFICE
CERTIFICATE OF CORRECTION

PATENT NO. : 12,133,402 B2  
APPLICATION NO. : 18/340664  
DATED : October 29, 2024  
INVENTOR(S) : Dongkyu Seo et al.

Page 1 of 1

It is certified that error appears in the above-identified patent and that said Letters Patent is hereby corrected as shown below:

In the Claims

In Column 73, Line 24, in Claim 7, delete "(TI)" and insert -- (Tl) --.

In Column 73, Line 36, in Claim 8, delete "TII," and insert -- TlI, --.

In Column 73, Line 37, in Claim 8, delete "COI$_2$," and insert -- CoI$_2$, --.

In Column 73, Line 37, in Claim 8, delete "AII$_3$," and insert -- AlI$_3$, --.

Signed and Sealed this  
Eleventh Day of March, 2025

Coke Morgan Stewart  
*Acting Director of the United States Patent and Trademark Office*